(12) United States Patent
Ohsawa

(10) Patent No.: US 8,809,691 B2
(45) Date of Patent: Aug. 19, 2014

(54) WIRED CIRCUIT BOARD HAVING FIRST AND SECOND CONDUCTIVE PATTERNS WITH RESPECTIVE CONNECTING PORTIONS FORMED ON FIRST AND SECOND INSULATING LAYERS

(75) Inventor: Tetsuya Ohsawa, Osaka (JP)

(73) Assignee: Nitto Denko Corporation, Osaka (JP)

( * ) Notice: Subject to any disclaimer, the term of this patent is extended or adjusted under 35 U.S.C. 154(b) by 48 days.

(21) Appl. No.: 13/554,799

(22) Filed: Jul. 20, 2012

(65) Prior Publication Data
US 2013/0020112 A1    Jan. 24, 2013

Related U.S. Application Data

(60) Provisional application No. 61/573,075, filed on Aug. 26, 2011.

(30) Foreign Application Priority Data

Jul. 21, 2011  (JP) .................................. 2011-159688
Aug. 22, 2011 (JP) .................................. 2011-180971

(51) Int. Cl.
*H05K 1/03* (2006.01)
*G11B 5/48* (2006.01)
*H05K 1/05* (2006.01)

(52) U.S. Cl.
CPC .............. *G11B 5/4853* (2013.01); *G11B 5/486* (2013.01); *H05K 1/056* (2013.01)
USPC .......................................... 174/255; 174/260

(58) Field of Classification Search
USPC .......... 174/255, 250, 251, 254, 260, 261, 267
See application file for complete search history.

(56) References Cited

U.S. PATENT DOCUMENTS

2010/0097728 A1    4/2010  Koganezawa
2010/0118443 A1    5/2010  Ohsawa et al.

FOREIGN PATENT DOCUMENTS

JP    2010118096 A    5/2010
WO    2009004689 A1   1/2009

*Primary Examiner* — Tremesha S Willis
(74) *Attorney, Agent, or Firm* — Jean C. Edwards; Edwards Neils PLLC

(57) ABSTRACT

A wired circuit board includes an insulating layer, and a conductive layer formed on the insulating layer. The insulating layer includes a first insulating layer, and a second insulating layer formed on the first insulating layer. The conductive layer includes a first conductive pattern, and a second conductive pattern. The first conductive pattern includes a first connecting portion formed on the first insulating layer and under the second insulating layer, and at least one pair of first terminals configured continuously to the first connecting portion so as to electrically connect to an external electronic element and spaced apart from each other to allow the electronic element to extend therebetween. The second conductive pattern includes a second connecting portion formed on the second insulating layer, and a second terminal configured continuously to the second connecting portion so as to electrically connect to a magnetic head provided on an external slider.

8 Claims, 23 Drawing Sheets

FIG.6
(a)
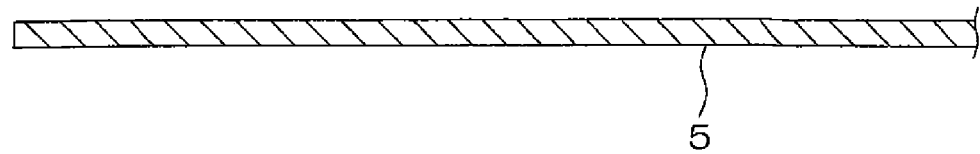
(b)
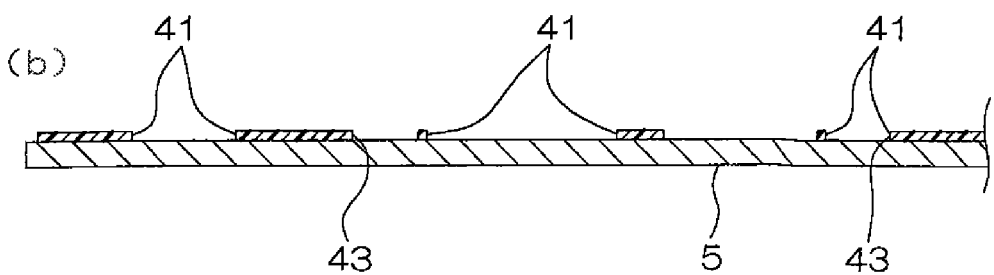
(c)
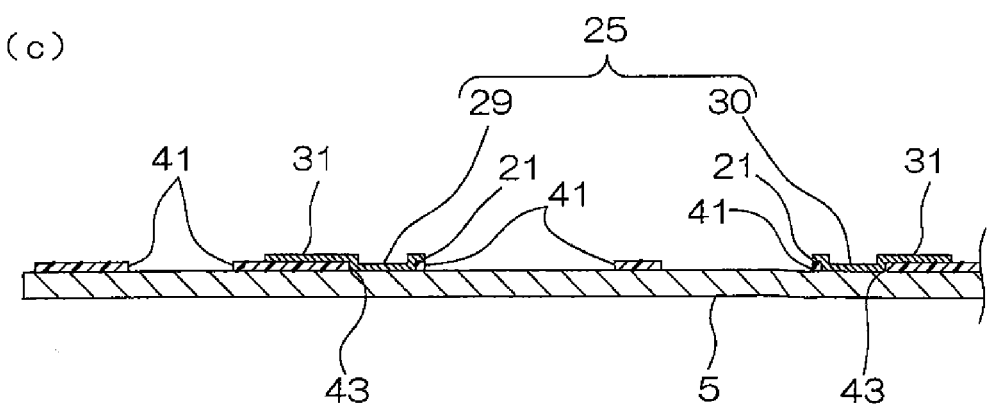
(d)
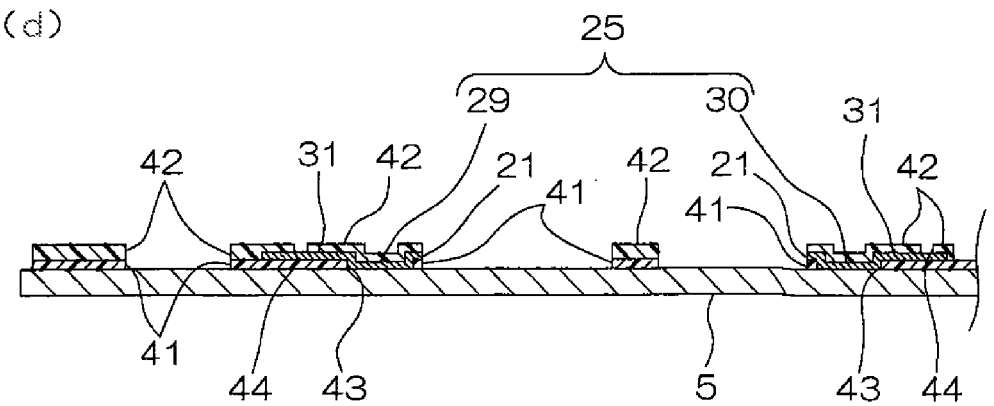

FIG.7
(e)
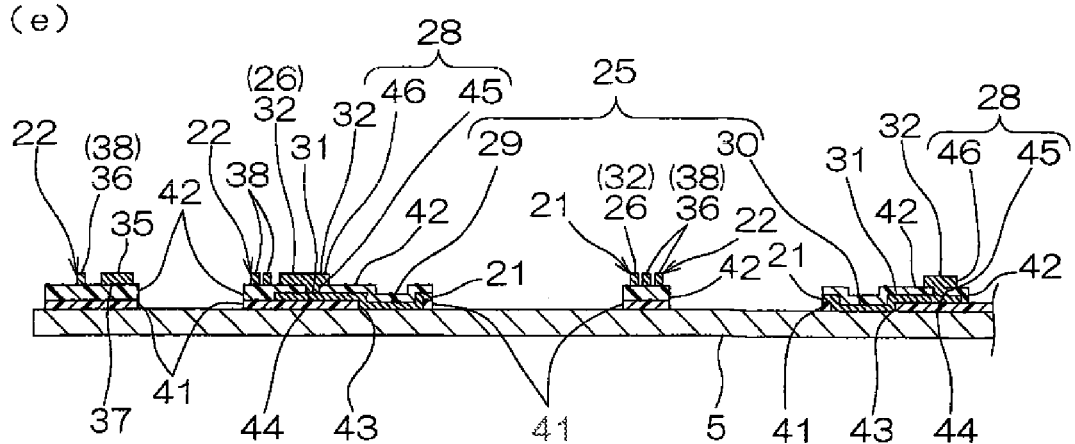
(f)
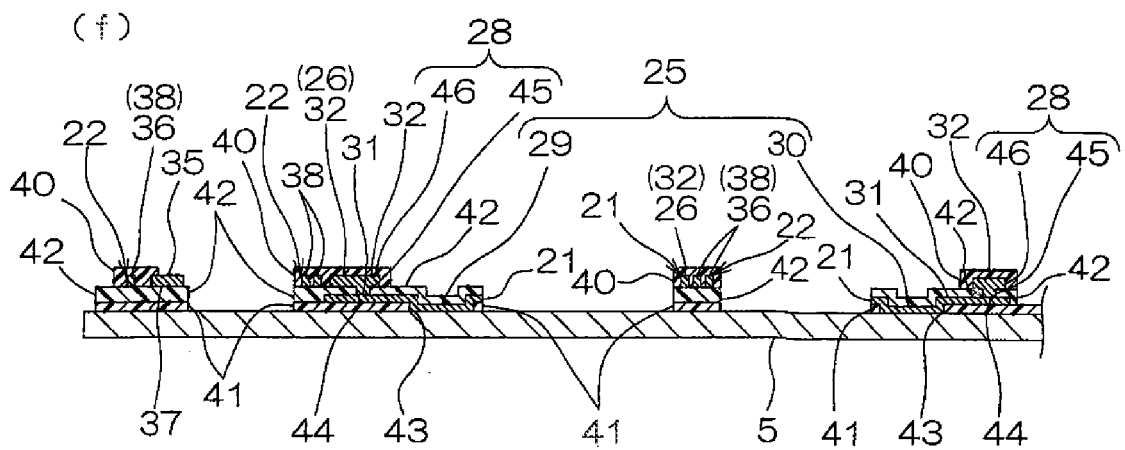
(g)
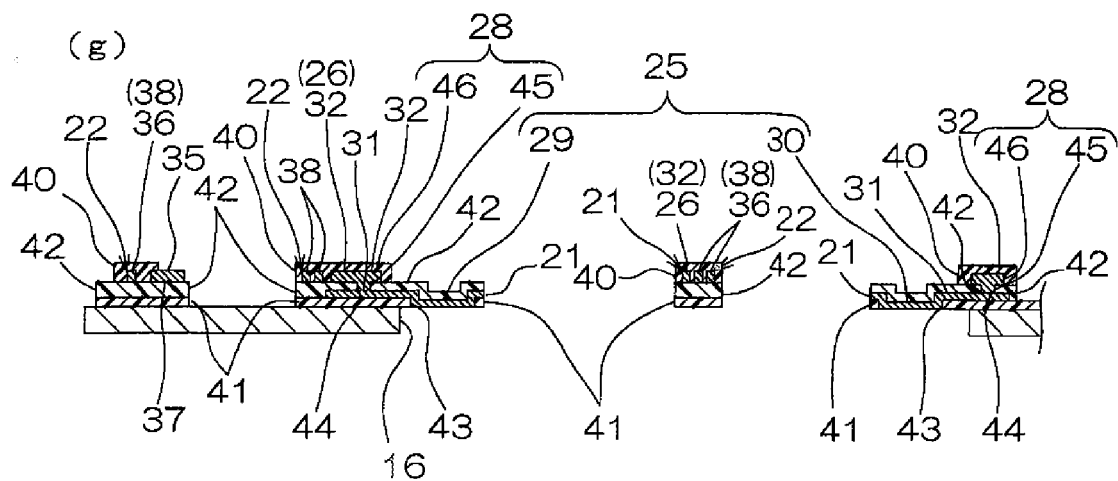

FIG.11
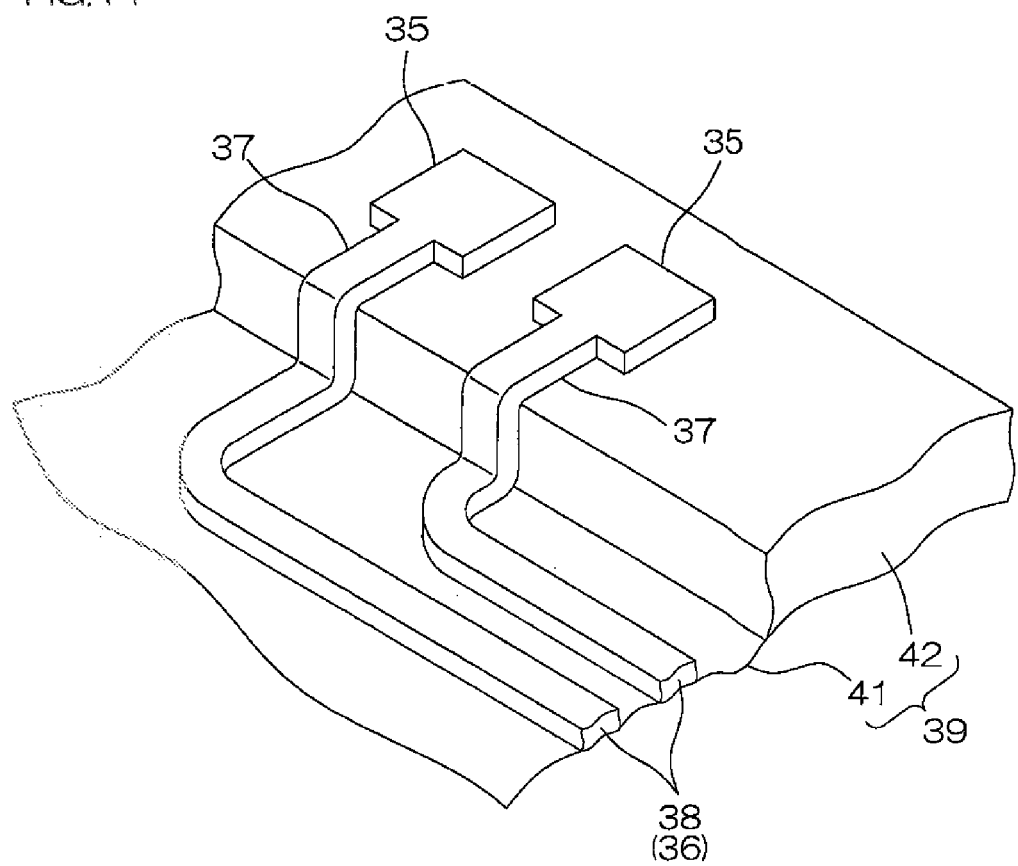
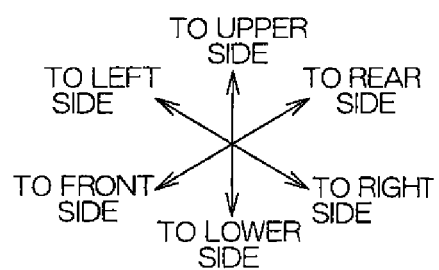

FIG.12
(a)
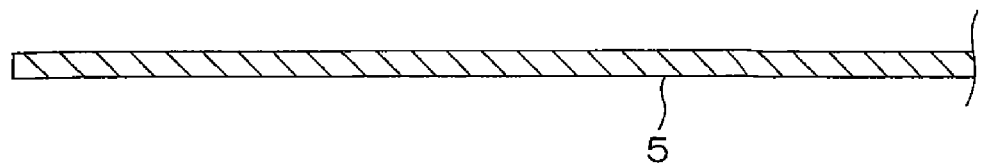
(b)
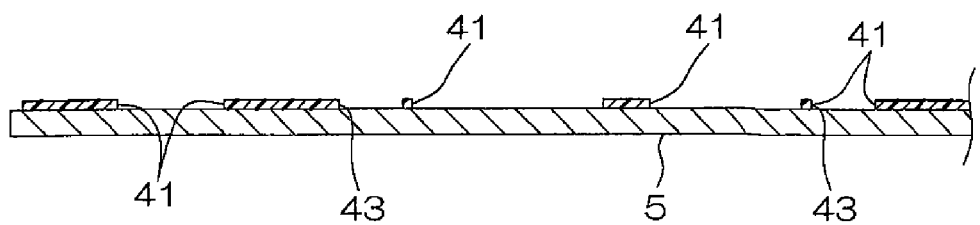
(c)
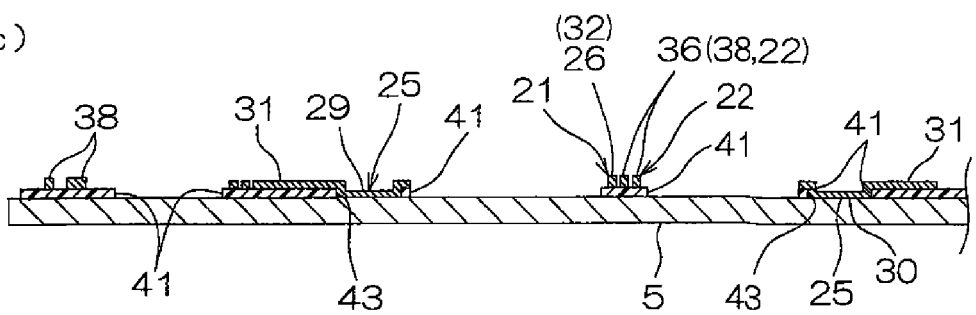
(d)
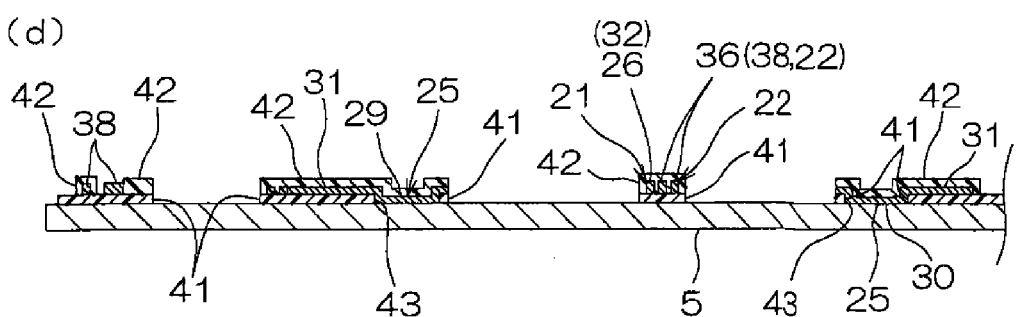

FIG.13
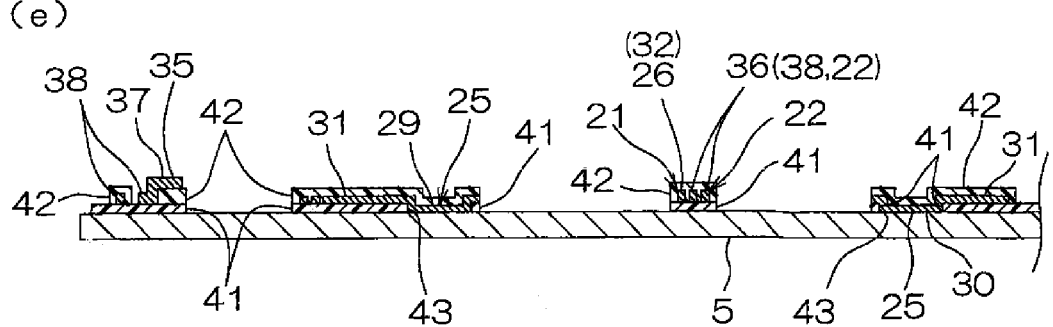
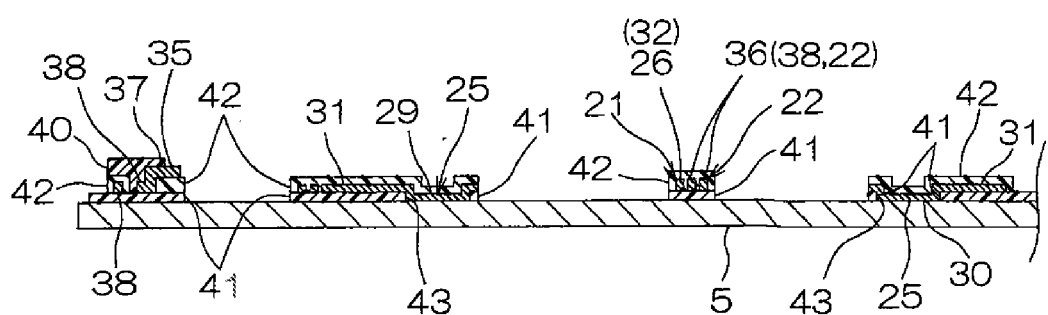
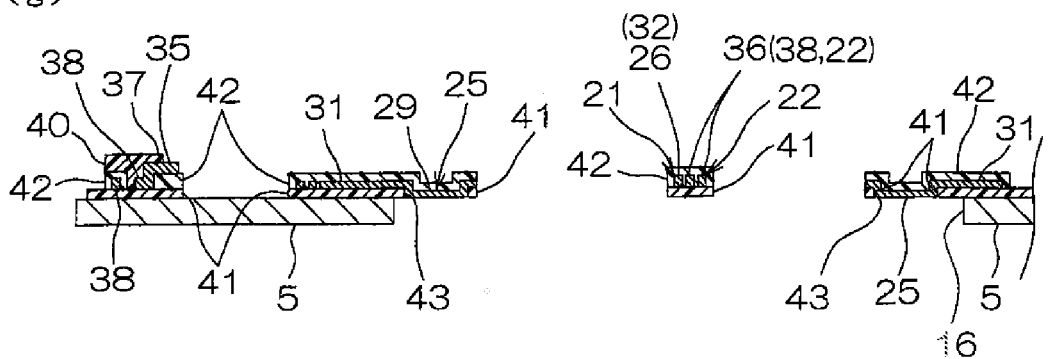

FIG.15
(a)
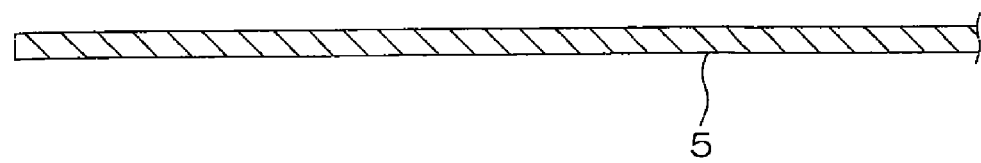
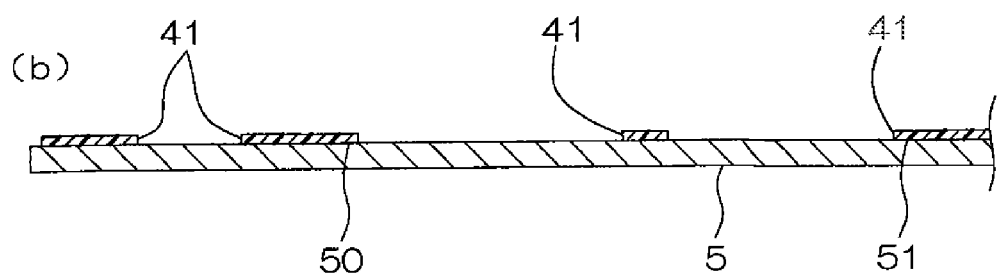
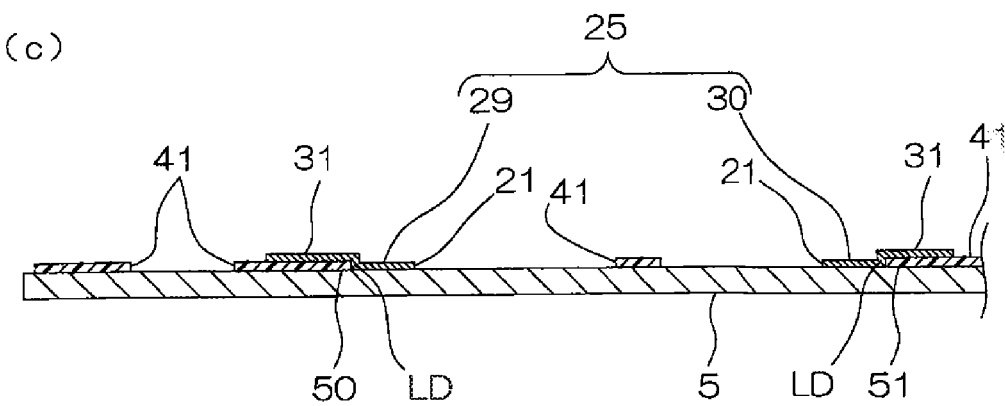
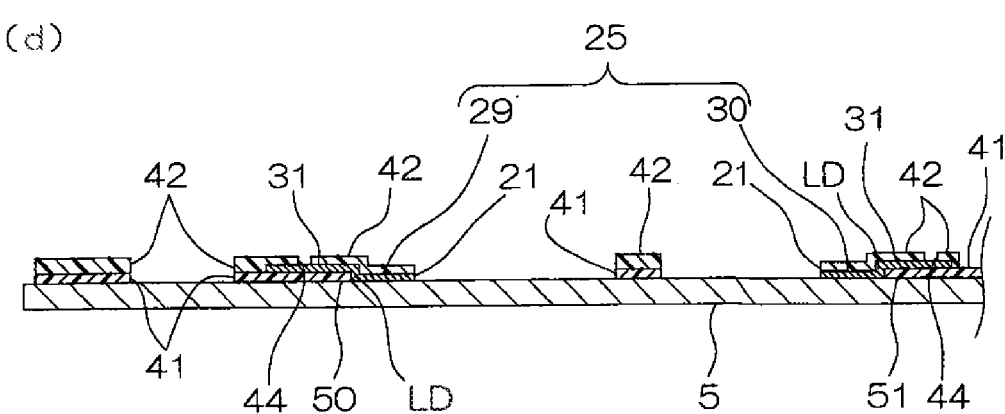

FIG. 16
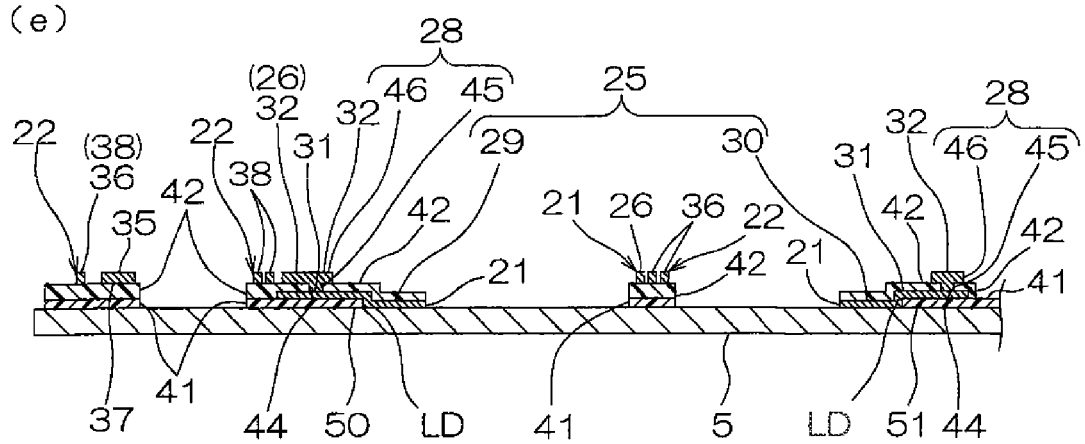
(e)
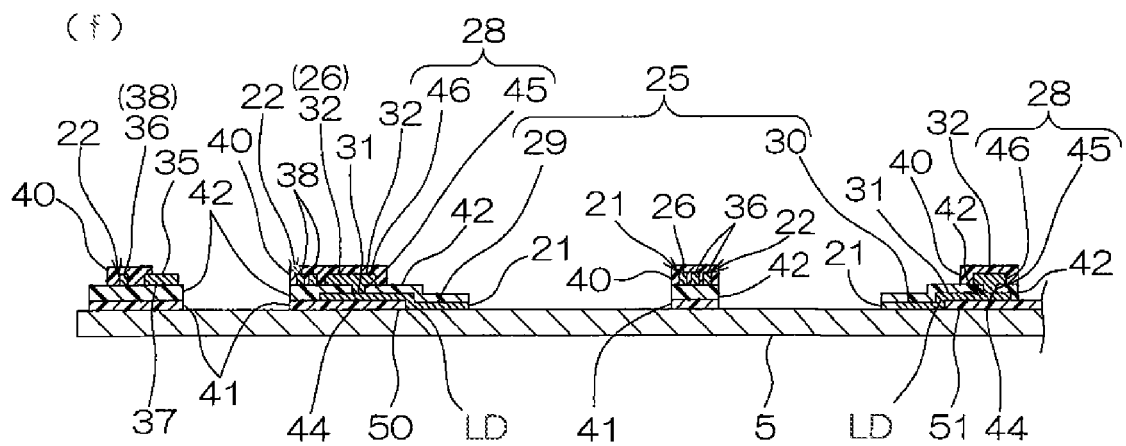
(f)
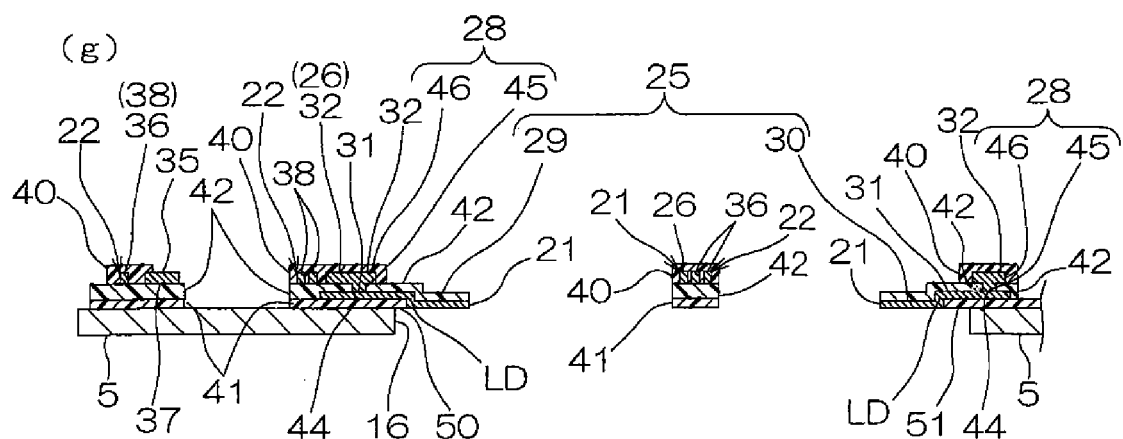
(g)

FIG.18
(a)
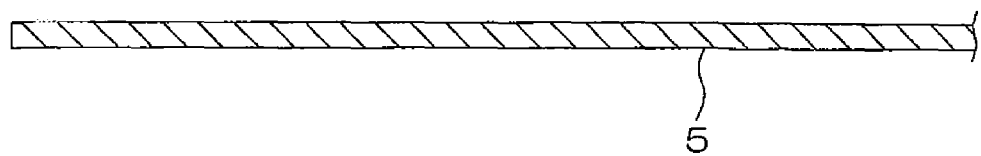
(b)
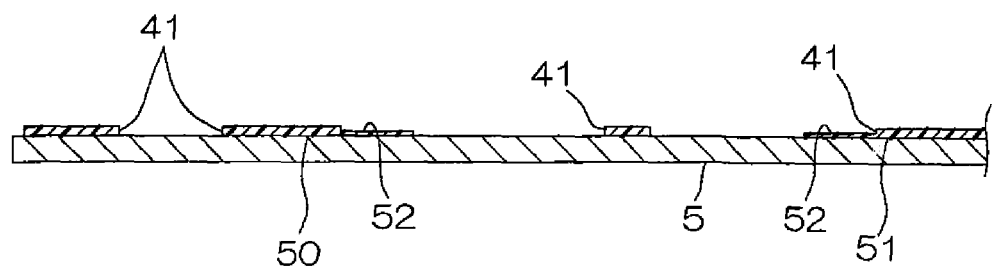
(c)
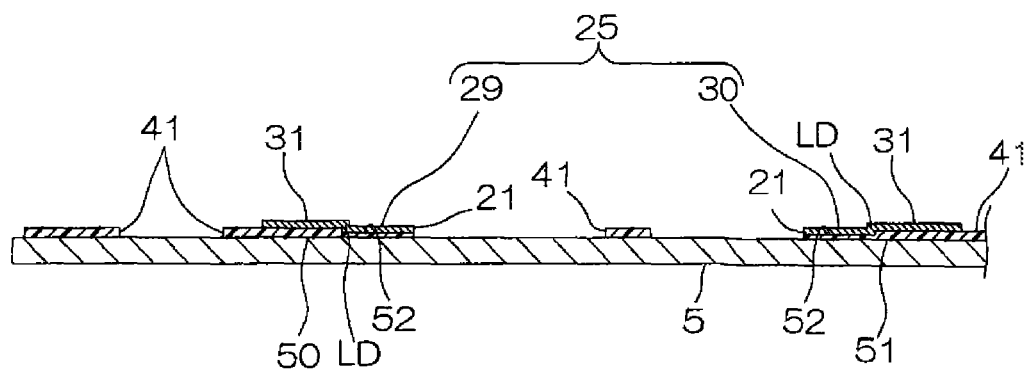
(d)
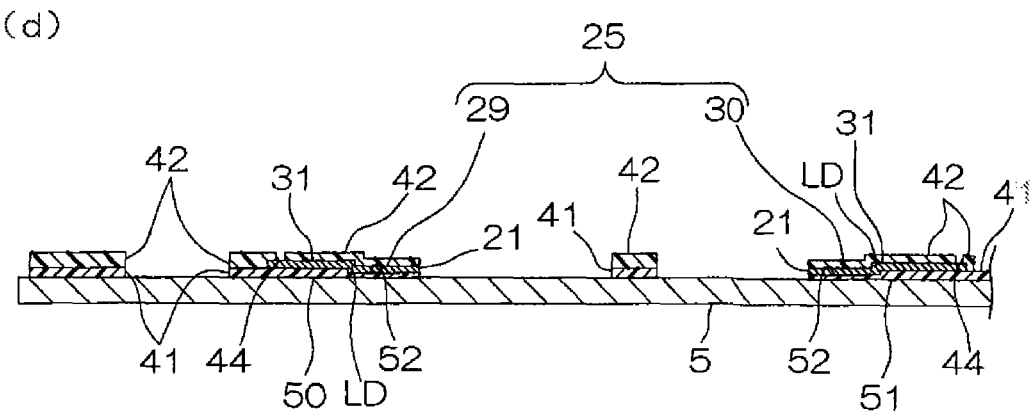

FIG. 19
(e)
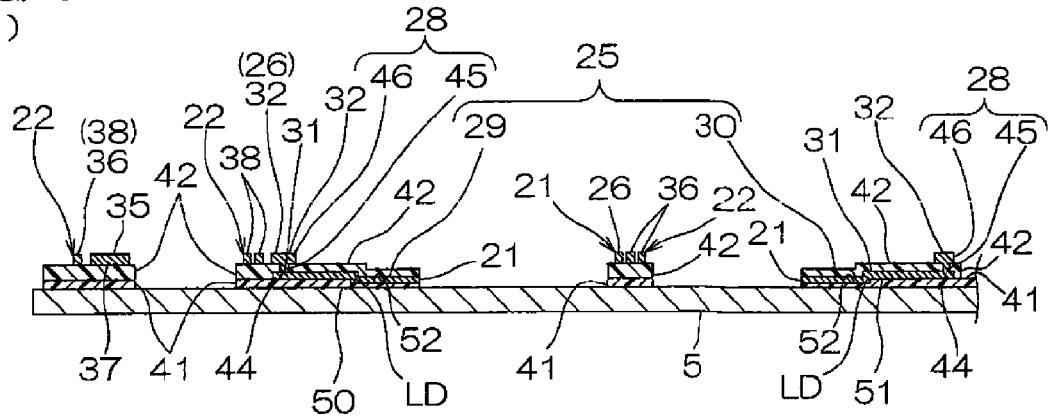
(f)
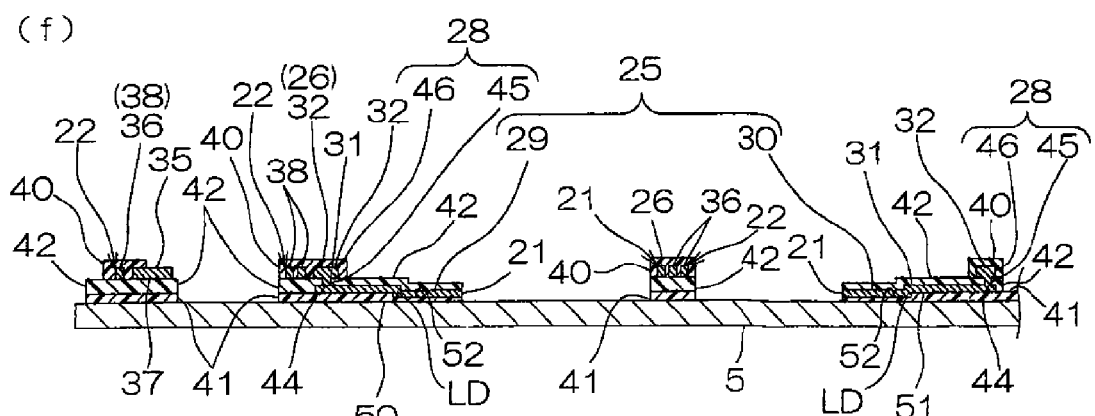
(g)
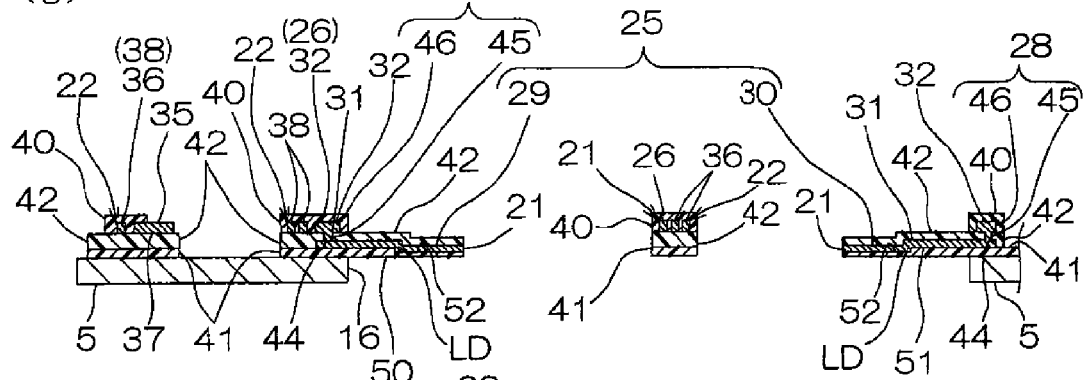
(h)
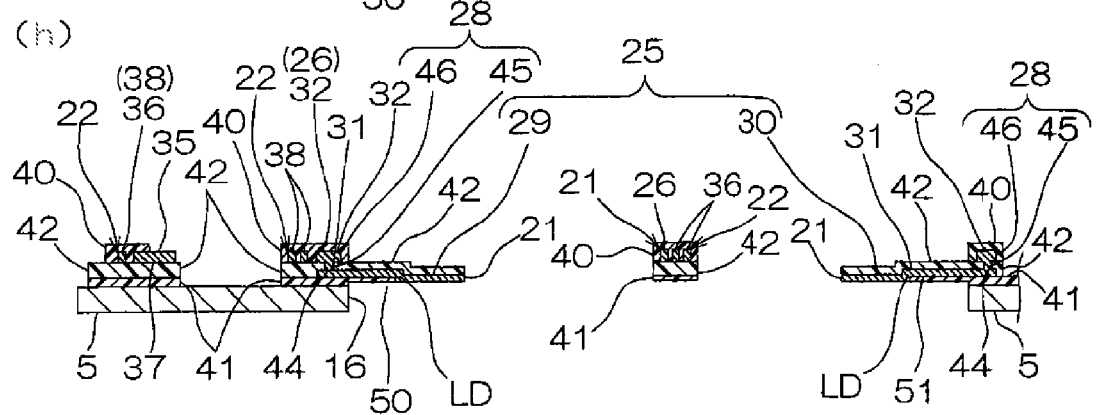

FIG.21
(a)
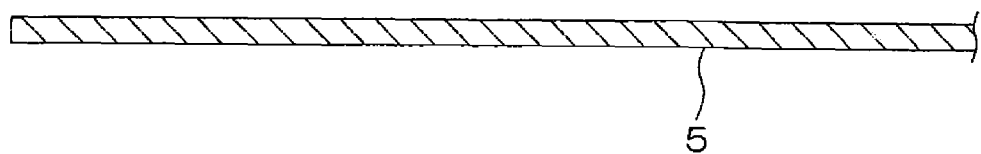
(b)
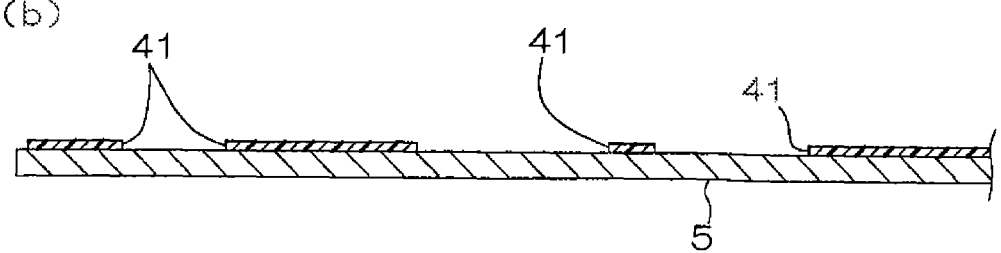
(c)
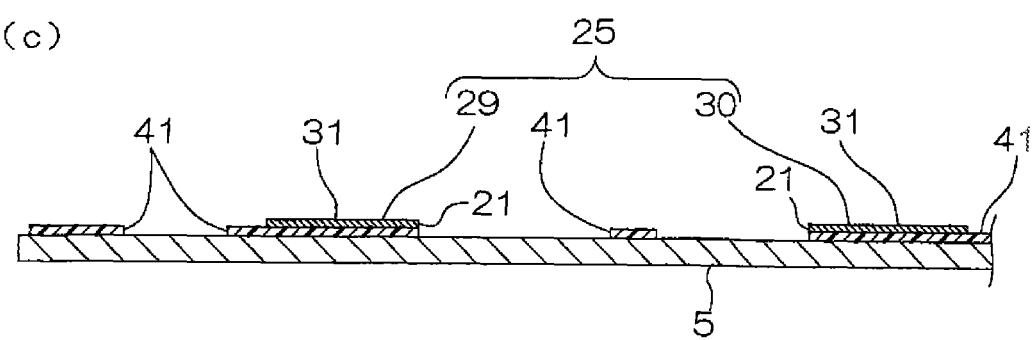
(d)
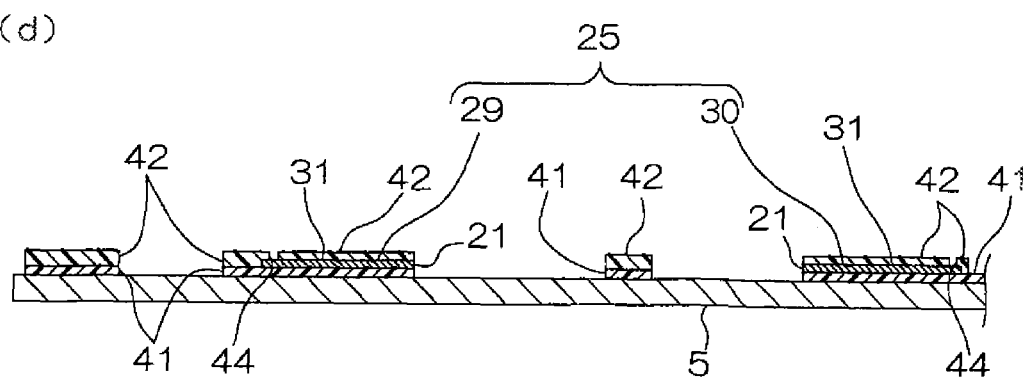

FIG.22
(e)
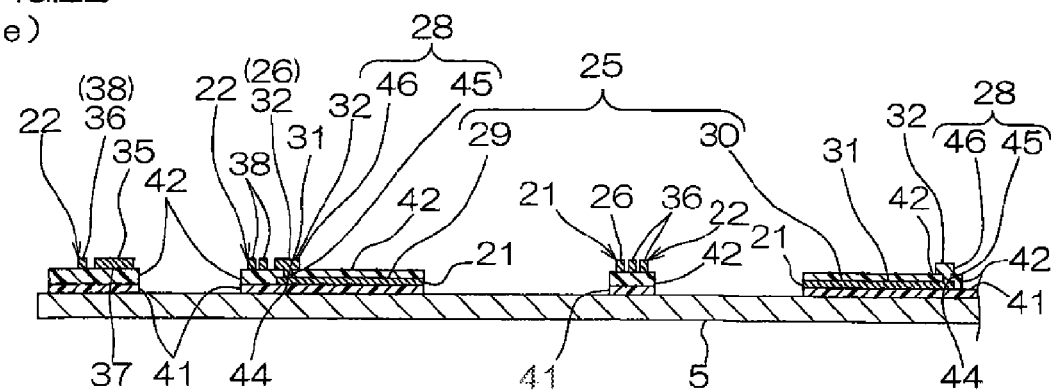
(f)
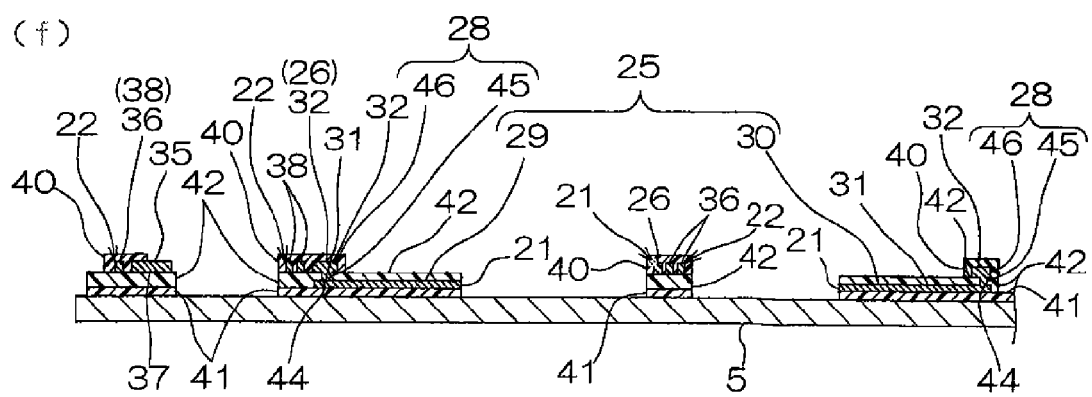
(g)
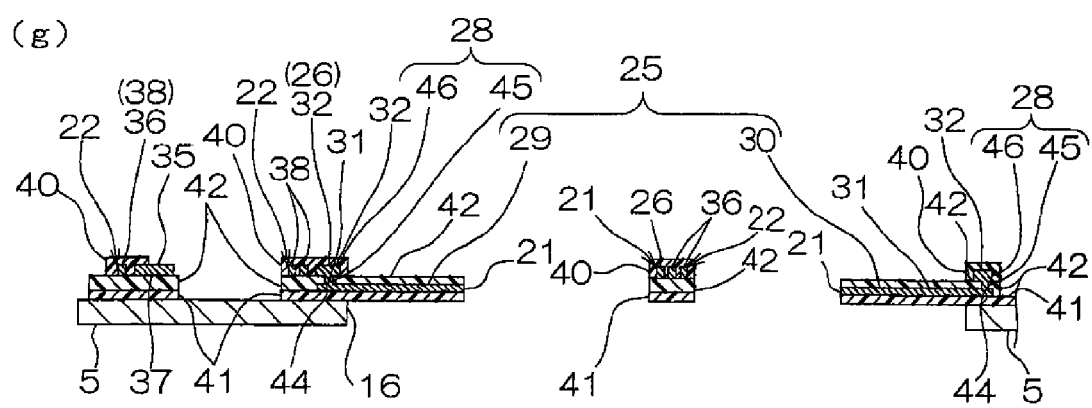
(h)
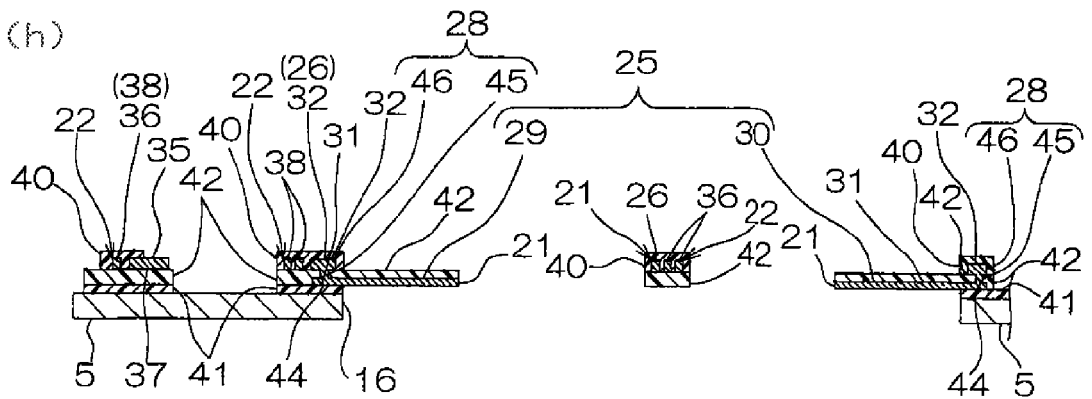

WIRED CIRCUIT BOARD HAVING FIRST AND SECOND CONDUCTIVE PATTERNS WITH RESPECTIVE CONNECTING PORTIONS FORMED ON FIRST AND SECOND INSULATING LAYERS

CROSS-REFERENCE TO RELATED APPLICATION

The present application claims the benefit of U.S. Provisional Application No. 61/573,075 filed on Aug. 26, 2011, and claims priority from Japanese Patent Applications No. 2011-159688 filed on Jul. 21, 2011 and Japanese Patent Applications No. 2011-180971 filed on Aug. 22, 2011, the contents of which are hereby incorporated by reference into this application.

BACKGROUND OF THE INVENTION

1. Field of the Invention

The present invention relates to a wired circuit board, and particularly to a wired circuit board used suitably as a suspension board with circuit used in a hard disk drive.

2. Description of the Related Art

A suspension board with circuit includes a metal supporting board, an insulating base layer formed thereon, and a conductive pattern formed thereon and having head-side terminals for connecting to a magnetic head. In the suspension board with circuit, a magnetic head is mounted and connected to a head-side terminal portion to allow the suspension board with circuit to be used in a hard disk drive.

In recent years, it has been proposed to mount various electronic elements on such a suspension board with circuit. Specific examples of such electronic elements include a microactuator having a piezo-element (piezoelectric element) for precisely and finely adjusting the position and angle of a magnetic head.

For example, a head suspension assembly has been proposed which includes a flexure, an insulating layer laminated thereon, a wiring pattern laminated thereon, a magnetic head connected to the wiring pattern, and a microactuator connected to the wiring pattern (see, e.g., International Publication WO 2009/004689).

In the head suspension assembly proposed in International Publication WO 2009/004689, the terminals (magnetic-head terminals and actuator terminals) of the wiring pattern are forted on the insulating layer, and the magnetic head and the microactuator are connected to the terminals.

SUMMARY OF THE INVENTION

However, in the head suspension assembly proposed in International Publication WO 2009/004689, both of the magnetic head terminals and the actuator terminals are formed on the same insulating layer. Accordingly, on such an insulating layer, the magnetic head terminals and the actuator terminals should be formed at high densities, resulting in a problem that a short circuit is likely to occur therebetween.

To prevent the short circuit, it is necessary to ensure a wide space in which the head terminals and the actuator terminals are to be disposed over such an insulating layer. However, when the wide space is ensured, a problem arises that a suspension board with circuit on which the insulating layer is formed cannot be compactized.

It is therefore an object of the present invention to provide a wired circuit board in which the placement densities of a first connecting portion and a second connecting portion can be reduced, while the flexibility of design of the first connecting portion and the second connecting portion can be enhanced.

A wired circuit board of the present invention includes an insulating layer, and a conductive layer formed on the insulating layer. The insulating layer includes a first insulating layer, and a second insulating layer formed on the first insulating layer. The conductive layer includes a first conductive pattern, and a second conductive pattern. The first conductive pattern includes a first connecting portion formed on the first insulating layer and under the second insulating layer, and at least one pair of first terminals configured continuously to the first connecting portion so as to be electrically connected to an external electronic element and provided to be spaced apart from each other to allow the electronic element to extend therebetween. The second conductive pattern includes a second connecting portion formed on the second insulating layer, and a second terminal configured continuously to the second connecting portion so as to be electrically connected to a magnetic head provided on an external slider.

In the wired circuit board of the present invention, it is preferable that the first conductive pattern includes a first wire electrically connected to the first connecting portion, the second conductive pattern includes a second wire electrically connected to the second connecting portion, and the first wire and the second wire are formed on the second insulating layer or formed on the first insulating layer.

It is preferable that the wired circuit board of the present invention further includes a metal supporting board formed under the first insulating layer, and the metal supporting board is formed with an opening extending therethrough in a thickness direction to allow the electronic element to be disposed therein.

In the wired circuit board of the present invention, it is preferable that the opening is formed so as to overlap at least one part of the slider in the thickness direction.

In the wired circuit board of the present invention, it is preferable that the electronic element is a piezoelectric element.

It is preferable that the wired circuit board of the present invention is used as a suspension board with circuit.

In the wired circuit board of the present invention, the first connecting portion and the second connecting portion are respectively formed on the first insulating layer and the second insulating layer.

This can enhance flexibility in designing the layout of the first connecting portion and the second connecting portion and also allow the first terminal and the second terminal which are continued thereto to be formed at respective placement densities which do not cause a short circuit.

As a result, it is possible to achieve an improvement in the reliability of connection between the first terminal and the second terminal, while achieving compactization.

BRIEF DESCRIPTION OF THE DRAWINGS

FIG. 6 is a process view for illustrating a producing method of the suspension board with circuit shown in FIG. 1,
  (a) showing the step of preparing a metal supporting board,
  (b) showing the step of forming a first insulating base layer,
  (c) showing the step of forming element-side connecting portions and element-side terminals, and
  (d) showing the step of forming the second insulating base layer;

FIG. 7 is a process view for illustrating the producing method of the suspension board with circuit shown in FIG. 1, which is subsequent to FIG. 6,
  (e) showing the step of forming the first conductive patterns and the second conductive patterns,
  (f) showing the step of forming the insulating cover layer, and
  (g) showing the step of forming a first board opening and second board openings;

FIG. 11 shows a perspective view of head-side connecting portions;

FIG. 12 is a process view for illustrating a producing method of the suspension board with circuit shown in FIG. 9,
  (a) showing the step of preparing a metal supporting board,
  (b) showing the step of fanning a first insulating base layer,
  (c) showing the step of fanning first conductive patterns, external terminals, and head-wire outer portions, and
  (d) showing the step of forming a second insulating base layer;

FIG. 13 is a process view for illustrating the producing method of the suspension board with circuit shown in FIG. 9, which is subsequent to FIG. 12,
  (e) showing the step of forming the head-side connecting portions and head-side terminals,
  (f) showing the step of forming an insulating cover layer, and
  (g) showing the step of forming a first board opening and second board openings;

FIG. 15 is a process view for illustrating a producing method of the suspension board with circuit shown FIG. 14,
  (a) showing the step of preparing a metal supporting board,
  (b) showing the step of forming a first insulating base layer,
  (c) showing the step of forming first conductive patterns, external terminals, and head wire outer portions, and
  (d) showing the step of forming a second insulating base layer;

FIG. 16 is a process view for illustrating the producing method of the suspension board with circuit shown in FIG. 14, which is subsequent to FIG. 15,
  (e) showing the step of forming head-side connecting portions and head-side terminals,
  (f) showing the step of forming an insulating cover layer, and
  (g) showing the step of forming a first board opening and second board openings;

FIG. 18 is a process view for illustrating a producing method of the suspension board with circuit shown in FIG. 17,
  (a) showing the step of preparing a metal supporting board,
  (b) showing the step of forming a first insulating base layer,
  (c) showing the step of forming first conductive patterns, external terminals, and head-wire outer portions, and
  (d) showing the step of forming a second insulating base layer;

FIG. 19 is a process view for illustrating the producing method of the suspension board with circuit shown in FIG. 17, which is subsequent to FIG. 18,
  (e) showing the step of forming head-side connecting portions and head-side terminals,
  (f) showing the step of forming an insulating cover layer,
  (g) showing the step of forming a first board opening and second board openings, and
  (h) showing the step of etching the first insulating base layer exposed in the second board openings;

FIG. 21 is a process view for illustrating a producing method of the suspension board with circuit shown in FIG. 20,
  (a) showing the step of preparing a metal supporting board,
  (b) showing the step of forming a first insulating base layer,
  (c) showing the step of forming first conductive patterns, external terminals, and head-wire outer portions, and
  (d) showing the step of forming a second insulating base layer;

FIG. 22 is a process view for illustrating the producing method of the suspension board with circuit shown in FIG. 20, which is subsequent to FIG. 21,
  (e) showing the step of forming head-side connecting portions and head-side terminals,
  (f) showing the step of forming an insulating cover layer,
  (g) showing the step of forming a first board opening and second board openings, and
  (h) showing the step of etching the first insulating base layer exposed in the second board openings.

DETAILED DESCRIPTION OF THE INVENTION

First Embodiment

Figure 1:
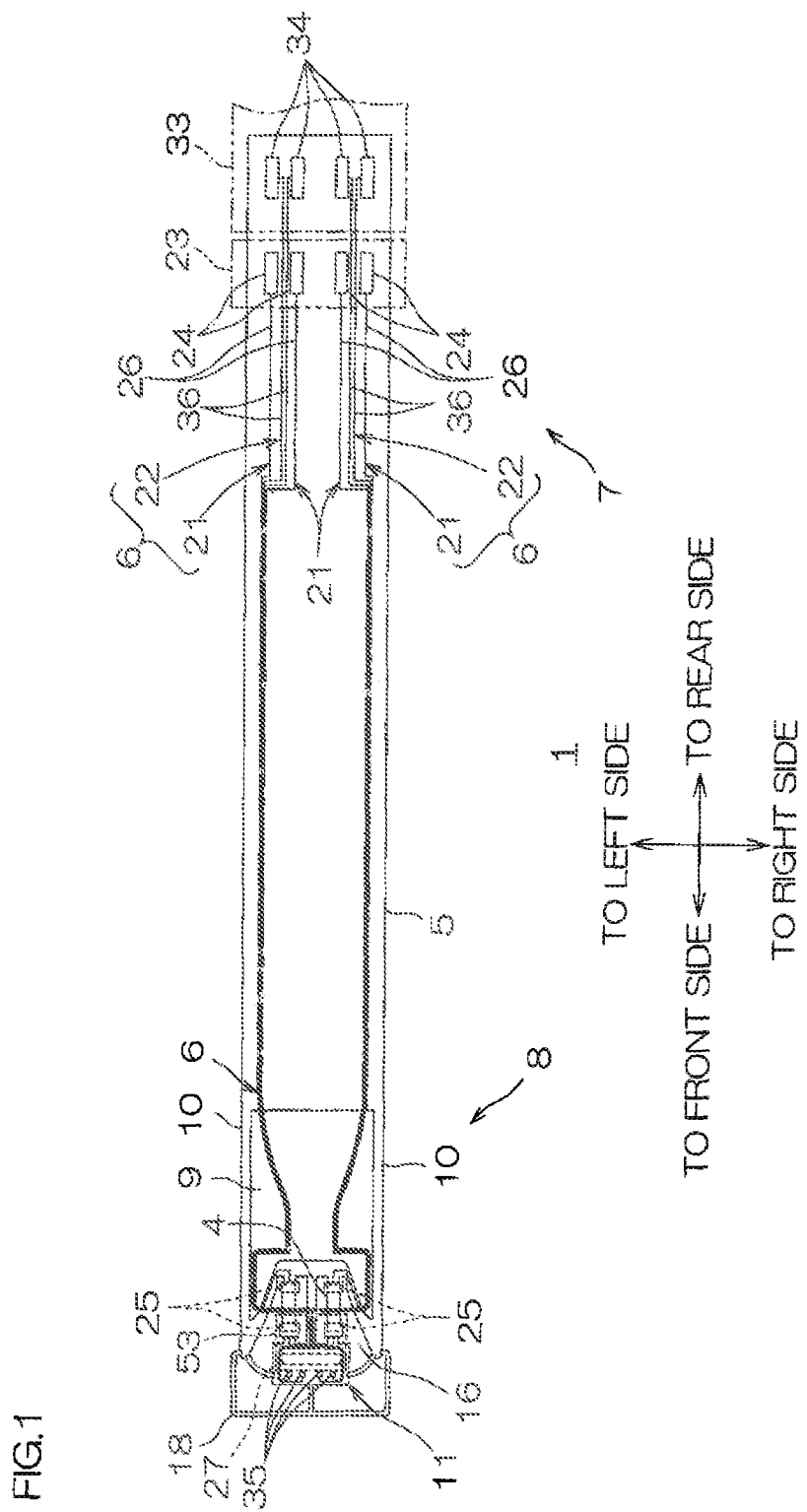
FIG. 1 shows a plan view of a suspension board with circuit as a first embodiment (a form in which element-wire supply-side portions and head-wire outer portions are formed on a second insulating base layer) of a wired circuit board of the present invention.
Figure 2:
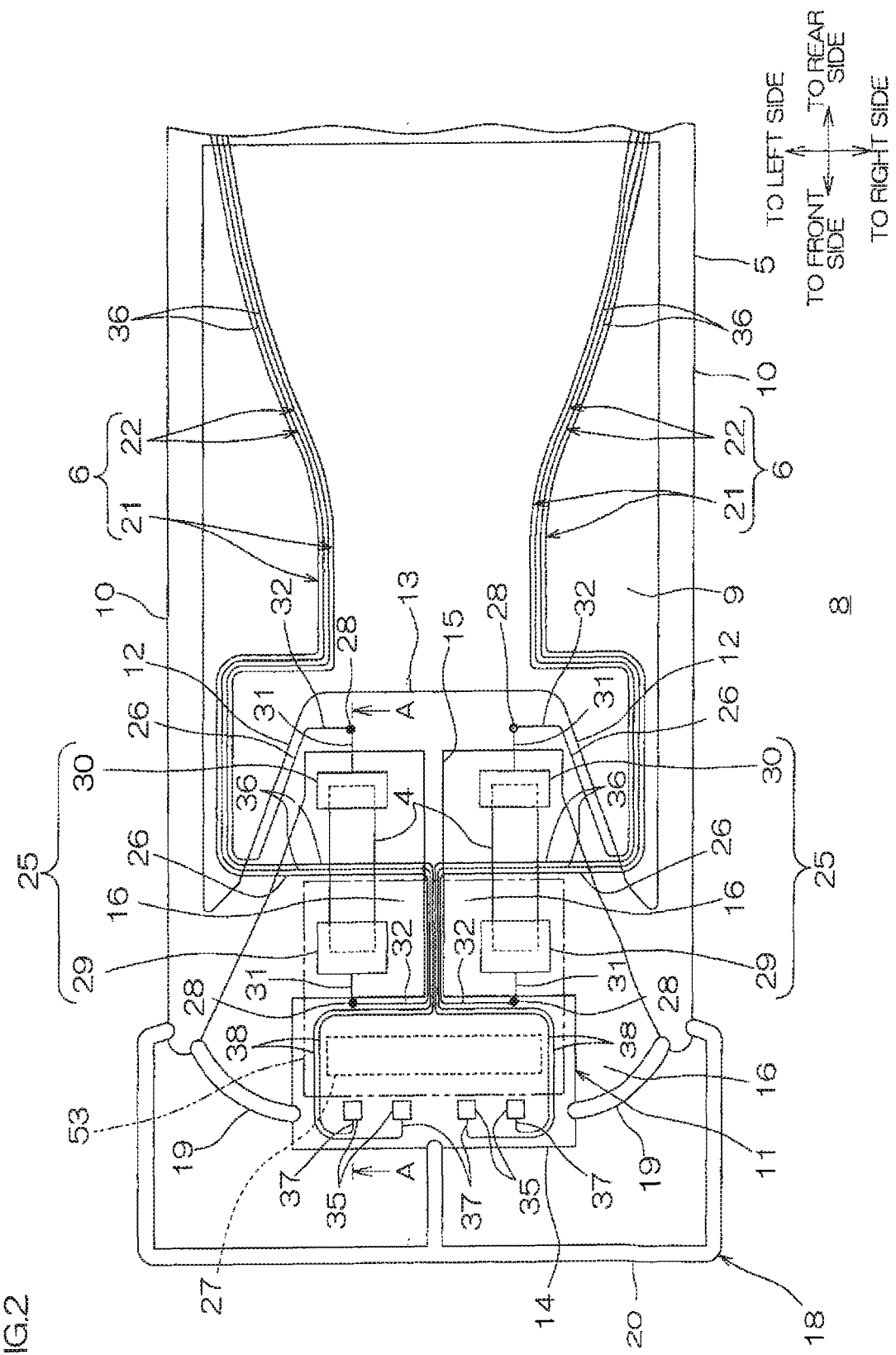
FIG. 2 shows an enlarged plan view of a gimbal portion of the suspension board with circuit shown in FIG. 1.
Figure 3:
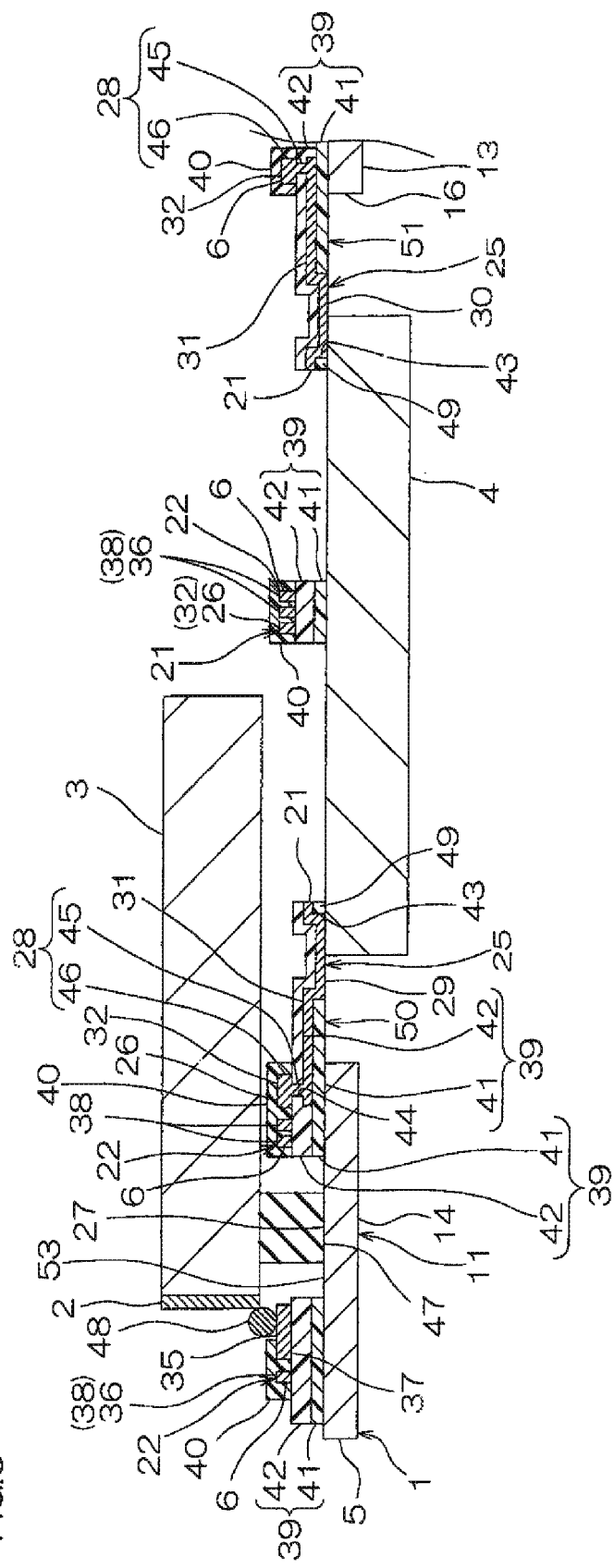
FIG. 3 shows a cross-sectional view along the line A-A of the gimbal portion shown in FIG. 2.
Figure 4:
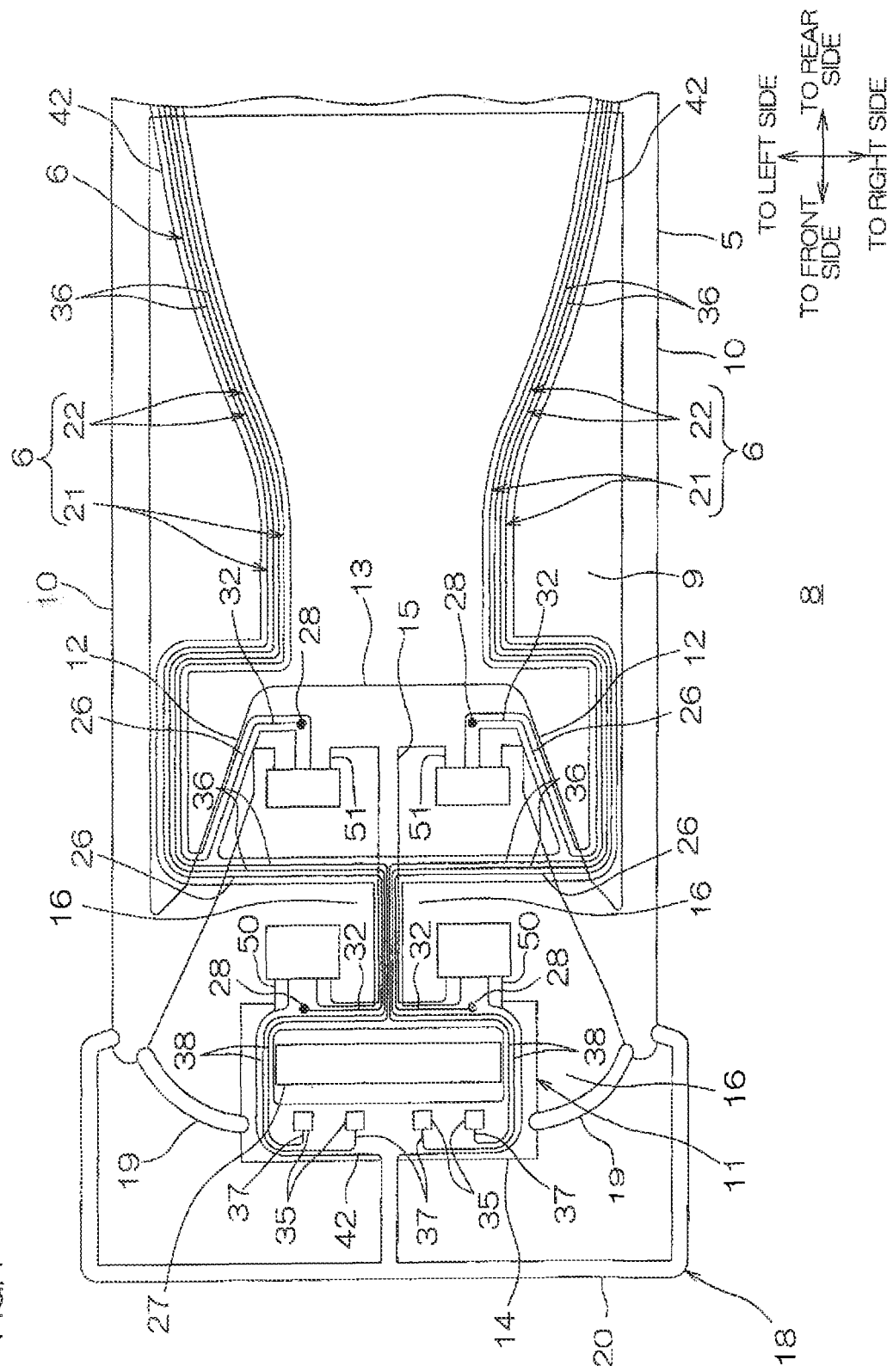
FIG. 4 shows an enlarged plan view of the gimbal portion shown in FIG. 2, which is a plan view in which an insulating cover layer is omitted.
Figure 5:
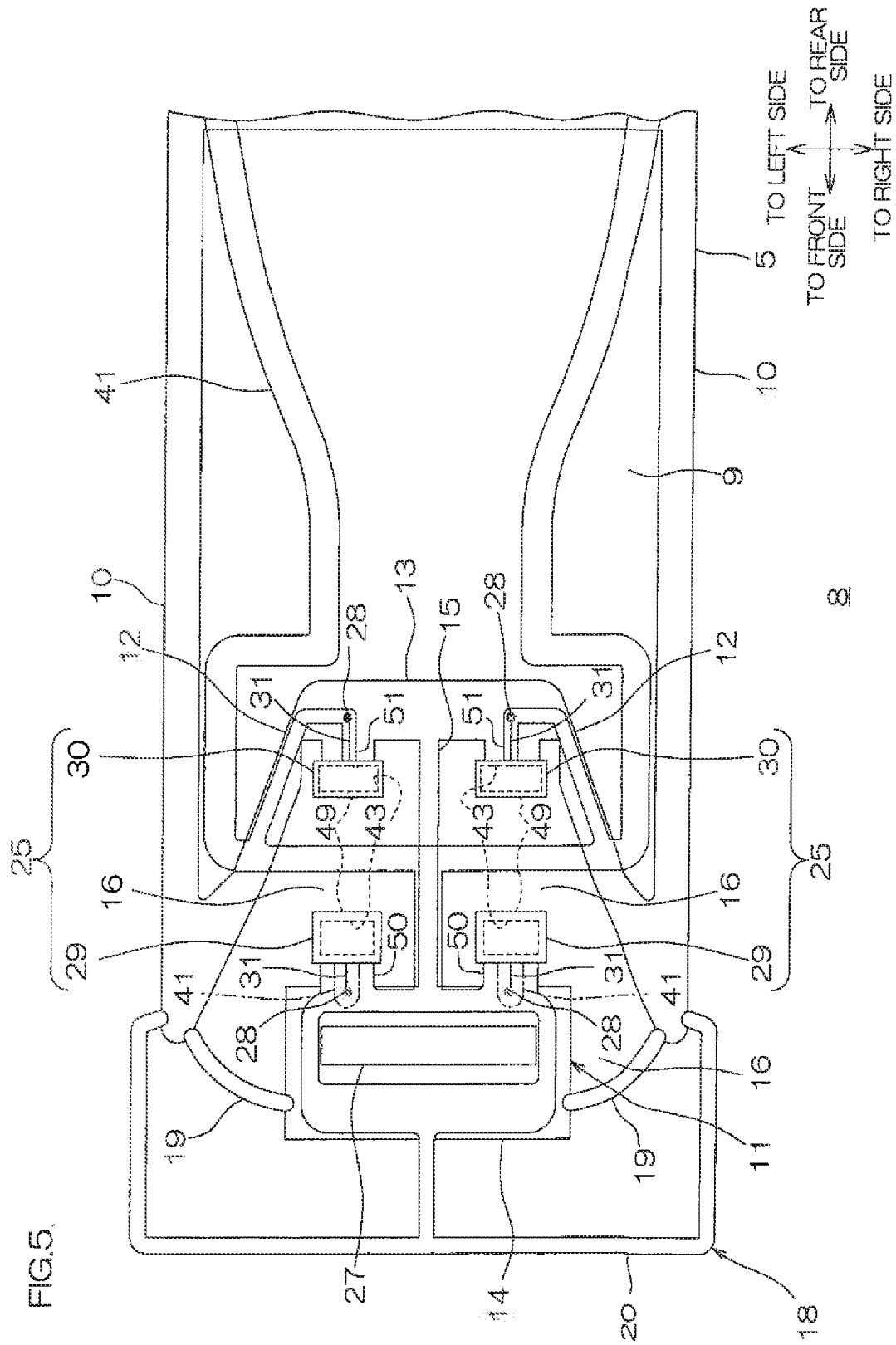
FIG. 5 shows an enlarged plan view of the gimbal portion shown in FIG. 2, which is a plan view in which the second insulating base layer, first conductive patterns and second conductive patterns each formed thereon, and the insulating cover layer are omitted.
Figure 8:
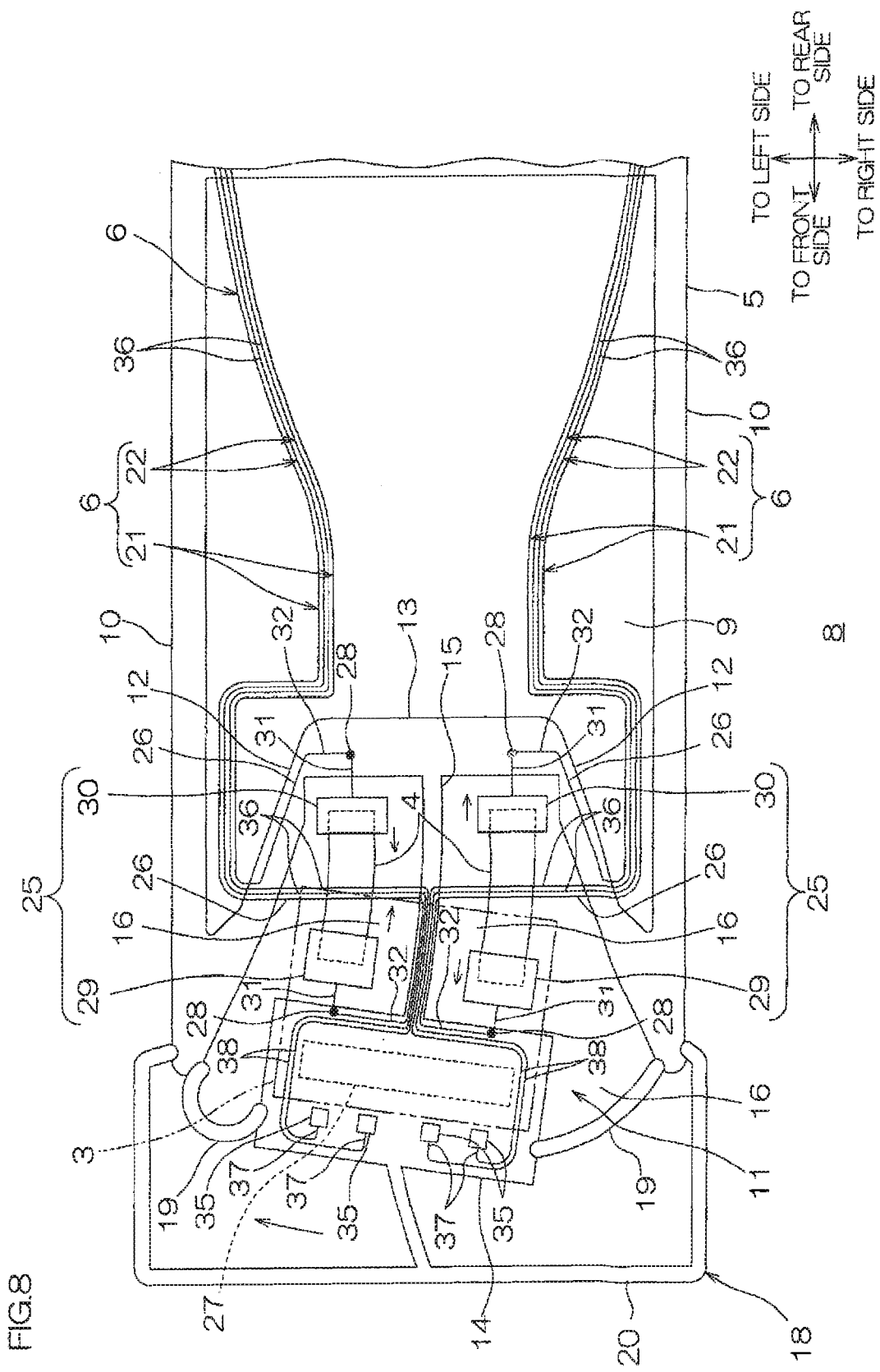
FIG. 8 shows a plan view of the stage of the gimbal portion shown in FIG. 2 that has been swung.

FIG. 1 shows a plan view of a suspension board with circuit as a first embodiment (a form in which element-wire supply-side portions and head-wire outer portions are formed on a second insulating base layer) of a wired circuit board of the present invention. FIG. 2 shows an enlarged plan view of a gimbal portion of the suspension board with circuit shown in FIG. 1. FIG. 3 shows a crass-sectional along the line A-A of the gimbal portion shown in FIG. 2. FIG. 4 shows an enlarged plan view of the gimbal portion shown in FIG. 2, which is a plan view in which an insulating cover layer is omitted. FIG. 5 shows an enlarged plan view of the gimbal portion shown in FIG. 2, which is a plan view in which the second insulating base layer, first conductive patterns and second conductive patterns each formed thereon, and the insulating cover layer are omitted. FIGS. 6 and 7 are process views each for illustrating a producing method of the suspension board with circuit shown in FIG. 1. FIG. 8 shows a plan view of the stage of the gimbal portion shown in FIG. 2 that has been swung.

Note that in FIGS. 1, 2, and 8, an insulating base layer 39 and an insulating cover layer 40 each described later are omitted for clear illustration of relative positioning of a conductive pattern 6, a slider 3, and piezoelectric elements 4 each described later.

As shown in FIGS. 1 and 2, a suspension board with circuit 1 is mounted in a hard disk drive with each of the slider 3 (see FIG. 3) for mounting thereon a magnetic head 2 and the piezoelectric elements 4 each as an electronic element being mounted thereon.

In the suspension board with circuit 1, the conductive layer 6 is supported on a metal supporting board 5.

The metal supporting board 5 is formed in a shape corresponding to the outer shape of the suspension board with circuit 1, and formed in a generally rectangular flat-belt plan view shape extending in a longitudinal direction. The metal supporting board 5 integrally includes a mama body portion 7, and a gimbal portion 8 formed the front side (one side in the longitudinal direction, the same holds true hereinbelow) of the main body portion 7.

The main body portion 7 is formed in a generally rectangular plan view shape.

The gimbal portion 8 is formed so as to extend from the front end of the main body portion 7 toward the front side. In the gimbal portion 8, a first board opening 9 in a generally rectangular plan view shape extending through the gimbal portion 8 in a thickness direction is formed.

The gimbal portion 8 includes outrigger portions 10 defined outside the first board opening 9 in widthwise direction (direction perpendicular to the longitudinal direction), and a tongue portion 11 coupled to the outrigger portions 10.

The outrigger portions 10 are formed so as to linearly extend from the both widthwise end portions of the main body portion 7 toward the front side.

The tongue portion 11 is provided widthwise inwardly from the outrigger portions 10, and coupled to the outrigger portions 10 via first coupling portions 12 extending widthwise inwardly and obliquely rearwardly from the front end portions of the outrigger portions 10.

The tongue portion 11 is formed in a generally H-shaped plan view shape which is open on both widthwise sides. That is, in the tongue portion 11, the both widthwise end portions of a middle portion in the front-rear direction are cut away (opened).

Specifically, the tongue portion 11 integrally includes a base portion 13 having a generally rectangular plan view shape extending long in the widthwise direction, a stage 14 disposed on the front side of the base portion 13 to be spaced apart therefrom and having a generally rectangular plan view shape extending long in the widthwise direction, and a middle portion 15 coupling the base portion 13 to the widthwise middle portion of the stage 14 and having a generally rectangular plan view shape which is long in the front-rear direction.

The tongue portion 11 has second board openings 16 as openings corresponding to the cut-away portions.

The second board openings 16 are formed on both widthwise sides of the middle portion 15. Each of the second board openings 16 is formed so as to extend through the metal supporting board 5 in the thickness direction thereof.

The middle portion of the stage 15 in the front-rear direction is defined as a mounting region 27 (broken line) on which the slider 3 is mounted. The mounting region 27 is formed in a generally rectangular plan view shape which is long in the widthwise direction. The mounting region is also included in the front end portion of a slider mounting region 53 (described later).

The stage 14 is connected to the outrigger portions 10 by a second coupling portion 18.

The second coupling portion 18 includes curved portions 19 which curvedly couple the respective front ends of the outrigger portions 10 to the both widthwise ends of the stage 14, and an E-shaped portion 20 which couples the respective front ends of the outrigger portions 10 to the widthwise middle of the front end of the stage 14.

The curved portions 19 curvedly extend widthwise inwardly and obliquely frontwardly from the front ends of the outrigger portions 10 to reach the both widthwise ends of the stage 14.

The E-shaped portion 20 has a generally E-shaped plan view shape. Specifically, the longitudinal portions of the E-shaped portions 20 extend from the front ends of the both outrigger portions 10 toward the front side to subsequently bend widthwise inwardly. After extending widthwise inwardly, the portions of the E-shaped portion 20 extending from the front ends of the both outrigger portions 10 are united and bent rearwardly to reach the widthwise middle of the front end of the stage 14.

The middle portion 5 is formed narrow and bendable in the widthwise direction.

The conductive layer 6 includes first conductive patterns 21 and second conductive patterns 22.

The first conductive patterns 21 and the second conductive patterns 22 are formed to extend over the main body portion 7 and the gimbal portion 8.

The first conductive patterns 21 electrically connect the piezoelectric elements 4 and a power source 23 (imaginary line) The plurality of (four) first conductive patterns 21 are formed over the main body portion 7 and the gimbal portion 8 to be widthwise spaced apart from each other.

The first conductive patterns 21 integrally include supply-side terminals 24 for connecting to the power source 23 (imaginary line), element-side terminals 25 each as a first terminal for connecting to the piezoelectric element 4, and element wires 26 for electrically connecting the supply-side terminals 24 and the element-side terminals 25.

The supply-side terminals 24 are provided on the rear end portion of the main body portion 7. The plurality of (four) supply-side terminals 24 each having a generally rectangular plan view shape are arranged in parallel to be widthwise spaced apart from each other.

As shown in FIGS. 2 and 5, the element-side terminals 25 are provided on the gimbal portion 8. More specifically, the element-side terminals 25 are provided in the second board openings 16 when projected in the thickness direction. The plurality of (four) element-side terminals 25 each having a generally rectangular plan view shape are arranged to be aligned and spaced apart from each other in the widthwise direction and in the front-rear direction.

Specifically, the element-side terminals 25 are provided to be paired up with each of the second board openings 16 being interposed therebetween. The two pairs of element-side terminals 25 are provided. The element-side terminals 25 forming each one of the pairs are respectively provided, on the front side and the rear side of each of the second board openings 16.

That is, the element-side terminals 25 include front element-side terminals 9 disposed on the front side, and rear element-side terminals 30 disposed on the rear side of the front element-side terminals 29 in spaced-apart and facing relation.

The front element-side terminals 29 are formed so as to rearwardly protrude from the rear end edges of the both widthwise outer portions of the stage 14 and face the inner surfaces of the second board openings 16. The plurality of (two) front element-side terminals 29 are arranged in parallel to be spaced apart from each other on both widthwise outsides of the middle portion 15. When projected in the thickness direction, the front element-side terminals 29 are also located in a plane of the slider mounting region 53 (described later) on which it is projected.

Specifically, the front element-side terminals 29 are formed such that the element wires 26 (described later) over the rear end portion of the stage 14 rearwardly protrude from the rear end edge of the stage 14 and outwardly protrude on both widthwise outsides.

Note that, as is described later, as shown in FIGS. 3 and 5, under the peripheral end portion of each of the front element-side terminals 29, the insulating base layer 39 (a projecting end portion 49 of the first insulating base layer 41 described later) formed under the element wire 26 over the rear end portion of the stage 14 is formed in a rectangular frame-like plan view shape to be continued thereto such that the front element-side terminal 29 is downwardly fitted in the frame of the projecting end portion 49 (described later). As a result, the back surface (lower surface) of the front element-side terminal 29 is exposed from the frame-like insulating base layer 39.

On the other hand, as shown in FIGS. 2 and 5, the rear element-side terminals 30 are formed so as to frontwardly protrude from the front end edges of the both widthwise outer portions of the base portion 13 and face the inner surfaces of the second board openings 16. The plurality of (two) rear element-side terminals 30 are arranged in parallel to be spaced apart from each other on both widthwise outsides of the middle portion 15.

Specifically, the rear element-side terminals 30 are formed such that the element wires 26 (described later) over the front end portion of the base portion 13 frontwardly protrude from the front end edge of the base portion 13 and outwardly protrude in both widthwise directions. Note that, as is described later, as shown in FIGS. 3 and 5, under the peripheral end portion of each of the rear element-side terminals 30, the insulating base layer 39 (projecting end portion 49 of the first insulating base layer 41 described later) formed under the element wire 26 over the front end portion of the based portion 13 is formed in a rectangular frame-like plan view shape to be continued thereto such that the rear element-side terminal 30 is downwardly fitted in such a frame of the projecting end portion 49 (described later). As a result, the back surface (lower surface) of the rear element-side terminal 30 is exposed from the frame-like insulating base layer 39.

As shown in FIGS. 1 and 2, the plurality of (four) element wires 26 are formed over the main body portion 7 and the gimbal portion 8 to be widthwise spaced apart from each other.

Specifically, the respective rear ends of the element wires 26 are continued to the supply-side terminals 24. More specifically, over the rear end portion of the main body portion 7, the element wires 26 extend from the supply-side terminals 24 toward the front side, and bend at middle points in the front-rear direction of the main body portion 7 into two separate branches extending outwardly in the both widthwise directions. Then, the element wires 26 bend at both widthwise end portions midway in the front-rear direction of the main body portion 7 toward the front side to extend along the widthwise outer edges toward the front end portion of the main body portion 7. After passing through the first board opening 9 in the gimbal portion 8, the element wires 26 in each of the two branches further separate into two branches, of which one extends widthwise inwardly and the other extends rearwardly obliquely and widthwise inwardly, over the first coupling portion 12.

The element wires 26 in the branches extending widthwise inwardly extend widthwise inwardly so as to traverse the second board openings 16 and converge at middle points in the front-rear direction of the middle portion 15. Then, the element wires 26 bend toward the front side to subsequently extend toward the front side along the middle portion 15, then bend at the rear end of the stage 14 into two separate branches extending outwardly in the both widthwise directions to subsequently extend along the peripheral end edge of the stage 14, and extend rearwardly via conductive portions 28 (described later) to reach the front element-side terminals 29.

On the other hand, the element wires 26 in the branches extending rearwardly obliquely and widthwise inwardly extend rearwardly obliquely and widthwise inwardly along the first coupling portions 12 to reach the both widthwise end portions of the base portion 13 and bend widthwise inwardly, and then extend toward the front side via the conductive portions 28 (described later) to reach the rear element-side terminals 30.

Note that the portions of the element wires 26 continued to the element-side terminals 25 are assumed to be element-side connecting portions 31 (the broken lines of FIG. 2) each as a first connecting portion, and the portions thereof other than the element-side connecting portions 31 are assumed to be element-wire supply-side portions 32 (the solid lines of FIG. 2) each as a first wire.

As shown in FIG. 5, the element-side connecting portions 31 are formed as the element wires 26 extending from the conductive portions 28 toward the front side and the rear side over the base portion 13 and the stage 14 to reach the element-side terminals 25 (front element-side terminals 29 and rear element-side terminals 30).

That is, the element-side connecting portions 31 over the stage 14 are formed as portions extending from the conductive portions 28 toward the rear side to reach the front element-side terminals 29, while the element-side connecting portions 31 over the base portion 13 are formed as portions extending from the conductive portions 28 toward the front side to reach the rear element-side terminals 30.

As shown in FIGS. 1 and 2, the second conductive patterns 22 electrically connect a read/write board 33 (the imaginary line) and the magnetic head 2 (see FIG. 3).

The second conductive patterns 22 include external terminals 34 for connecting to the read/write board 33, head-side terminals 35 each as a second terminal for connecting to the magnetic head 2, and head wires 36 electrically connecting the external terminals 34 and the head-side terminals 35.

The external terminals 34 are provided on the rear end portion of the main body portion 7. Specifically, the plurality of (four) external terminals 34 each having a generally rectangular plan view shape are disposed on the rear side of the element-side terminals 25 to be spaced apart therefrom and widthwise spaced apart from each other.

The head-side terminals 35 are provided on the front end portion of the main body portion 7. The plurality of (four)

head-side terminals 35 each having a generally rectangular plan view shape are arranged in parallel to be widthwise spaced apart from each other.

The head wires 36 are provided to extend over the main body portion 7 and the gimbal portion 8. The plurality of (four) head wires 36 are disposed to be widthwise spaced apart from each other.

The head wires 36 extend along the element wires 26 in the longitudinal direction. Specifically, the rear ends of the head wires 36 are continued to the external terminals 34. More specifically, over the rear end portion of the main body portion 7, the head wires 36 extend from the external terminals 34 toward the front side in such a manner as to bypass the supply-side terminals 24, and bend at middle points in the front-rear direction of the main body portion 7 into two separate branches extending outwardly in the both widthwise directions. Then, the head wires 36 bend at both widthwise end portions midway in the front-rear direction of the main body portion 7 toward the front side to extend toward the front end portion of the main body portion 7 along the widthwise outer end edges. After passing through the first board opening 9 in the gimbal portion 8, the head wires 36 extend widthwise inwardly so as to successively traverse the first coupling portions 12 and the second board openings 16 and converge at middle points in the front-rear direction of the middle portion 15. Then, the head wires 36 bend toward the front side to subsequently extend toward the front side along the middle portion 15. Then, over the rear end portion of the stage 14, the head wires 36 bend into two separate branches extending outwardly in the both widthwise directions to extend along the peripheral end edge of the stage 14. Thereafter, the head wires 36 are bent successively toward the front side, widthwise inwardly, and toward the rear side to reach the head-side terminals 35.

Note that the portions of the head wires 36 continued to the head-side terminals 35 are assumed to be head-side connecting portions 37 each as a second connecting portion, and the portions of the head wires 36 other than the head-side connecting portions 37 are assumed to be head-wire outer portions 38 each as a second wire.

The head-side connecting portions 37 are assumed to be the portions of the head wires 36 bent back over the stage 14 toward the rear side to extend in the front-rear direction and reach the head-side terminals 35.

As shown in FIG. 3, the suspension board with circuit 1 includes the metal supporting board 5, the insulating base layer 39 formed on the metal supporting board 5, the conductive layer 6 formed on the insulating base layer 39, and the insulating cover layer 40 formed on the insulating base layer 39 so as to cover the conductive layer 6.

The metal supporting board 5 is formed in a shape corresponding to the outer shape of the suspension board with circuit 1. The metal supporting board 5 is formed of a metal material such as, e.g., stainless steel, a 42-alloy, aluminum, a copper-beryllium alloy, or phosphor bronze. Preferably, the metal supporting board 5 is formed of stainless steel. The thickness of the metal supporting board 15 is in a range of e.g., 15 to 50 μm, or preferably 15 to 30 μm.

As shown in FIG. 3, the insulating base layer 39 is formed to extend over the main body portion 7 and the gimbal portion 8, and formed in a pattern corresponding to the portion in which the conductive layer 6 is formed. Note that, as shown in FIGS. 4 and 5, in the first board opening 9 and the second board openings 16 also, the insulating base layer 39 is formed in the pattern corresponding to the portion in which the conductive layer 6 is formed.

The insulating base layer 39 includes a first insulating base layer 41 as a first insulating layer, and a second insulating base layer 42 as a second insulating layer formed over the first insulating base layer 41.

As shown in FIGS. 3 and 5, the first insulating base layer 41 is provided on the upper surface of the metal supporting board 5 to extend over the main body portion 7 and the gimbal portion 8.

Also, the first insulating base layer 41 is formed with a front-side projecting portion 50 projecting from the rear end edge of the stage 14 toward the rear side and a rear-side projecting portion 51 projecting from the front end edge of the base portion 13 toward the front side in the second board openings 16. Each of the projecting end portions 49 of the front-side projecting portions 50 and the projecting end portions 49 of the rear-side projecting portion 51 is formed in a generally rectangular frame-like plan view shape having a first base opening 43 formed therein.

The first base opening 43 is formed in a generally rectangular plan view shape so as to extend through the first insulating base layer 41 in the thickness direction.

As shown in FIGS. 3 and 4, the second insulating base layer 42 is provided on the upper surface of the first insulating base layer 41 to extend between the main body portion 7 and the gimbal portion 8. The second insulating base layer 42 is formed to have substantially the same outer shape as that of the first insulating base layer 41 (except for the portions of the first insulating base layer 41 located in the second board openings 16) when projected in the thickness direction.

On the upper surface of the second insulating base layer 42, the second conductive patterns 22 (head-side terminals 35, external terminals 34 (see FIG. 1), and head wires 36 (head-side connecting portions 37 and head-wire outer portions 38)) and parts (element-wire supply-side portions 32 and supply-side terminals 24 (see FIG. 1)) of the first conductive patterns 21 are formed.

Also, in the second insulating base layer 42, four second base openings 44 corresponding to the four conductive portions 28 are formed. Each of the second base openings 44 is formed in a generally circular plan view shape so as to extend through the second insulating base layer 42 in the thickness direction.

Note that the first insulating base layer 41 and the second insulating base layer 42 are formed also in a pattern for forming the second coupling portion 18.

The first insulating base layer 41 and the second insulating base layer 42 are each formed of an insulating material such as a synthetic resin such as, e.g., a polyimide resin, a polyamideimide resin, an acrylic resin, a polyether nitrile resin, a polyether sulfone resin, a polyethylene terephthalate resin, a polyethylene naphthalate resin, or a polyvinyl chloride resin. Preferably, the first insulating base layer 41 and the second insulating base layer 42 are each formed of a polyimide resin.

The thickness of each of the first insulating base layer 41 and the second insulating base layer 42 is in a range of, e.g., 1 to 35 μm, or preferably 3 to 15 μm.

As described above, the conductive layer 6 is formed in a wired circuit pattern including the first conductive patterns 21 and the second conductive patterns 22 on the upper surface of the insulating base layer 39.

Note that the first conductive patterns 21 include the conductive portions 28 described later in detail.

In the first conductive patterns 21, the front element-side terminals 29 and the rear element-side terminals 30 are formed such that the middle portions thereof are downwardly fitted in the first base openings 43 of the first insulating base layer 41. As a result, the lower surfaces of the front element-side terminals 29 and the rear element-side terminals 30 are exposed from the first insulating base layer 41 while facing downward.

Note that the lower surfaces of the middle portions of the font element-side terminals 29 are formed flush with the lower surface of the first insulating base layer 41 formed under the peripheral end portion thereof in the widthwise direction and in the front-rear direction. Also, the lower surfaces of the middle portions of the rear element-side terminals 30 are formed flush with the lower surface of the first insulating base layer 41 formed under the peripheral end portion thereof in the widthwise direction and in the front-rear direction.

The conductive layer 6 is formed of a conductive material such as, e.g., copper, nickel, gold, a solder, or an alloy thereof. Preferably, the conductive layer 6 is formed of copper.

The thickness of each of the first conductive patterns 21 and the second conductive patterns 22 is in a range of, e.g., 3 to 50 μm, or preferably 5 to 20 μm. The width and length (longitudinal length) of each of the supply-side terminals 24, the element-side terminals 25, the external terminal 34, and the head-side terminals 35 are in a range of, e.g., 15 to 1000 μm, or preferably 20 to 800 μm.

The insulating cover layer 40 is formed to extend over the main body portion 7 and the gimbal portion 8, and formed on the insulating base layer 39 so as to cover the conductive layer 6. Specifically, the insulating cover layer 40 is formed on the second insulating base layer 42 into a pattern covering the element wires (element-wire supply-side portions 32 described later) and the head wires 36 (head-side connecting portions 37 and head-wire outer portions 38 each described later), and exposing the supply-side terminals 24 (FIG. 1) and the external terminals 34 (FIG. 1).

The insulating cover layer 40 is formed of the same insulating material as the insulating material forming the insulating base layer 39. The thickness of the insulating cover layer 40 is in a range of, e.g., 1 to 40 μm or preferably 3 to 10 μm.

Next, the element-side connecting portions 31 and the conductive portions 28 are described in detail.

Note that, of the four element-side connecting portions 31 and the four conductive portions 28, only the element-side connecting portion 31 and the conductive portion 28 which are provided on the front side of the second board opening 16 on one widthwise side (left side) of the middle portion 15 are described by way of examples. However, the other three element-side connecting portions 31 and the other three conductive portions have the same shapes 28 as described above.

As shown in FIGS. 3 and 5, the element-side connecting portion 31 is formed over the first insulating base layer 41 and under the second insulating base layer 42. Specifically, the element-side connecting portion 31 is formed on the upper surface of the first insulating base layer 41 into a pattern extending in the front-rear direction so as to be covered by the second insulating base layer 42.

The rear end portion of the element-side connecting portion 31 is continued to the front element-side terminal 29. In this manner, the element-side connecting portion 31 is electrically connected to the front element-side terminal 29.

The front end portion of the element-side connecting portion 31 is electrically connected to the element-wire supply-side portion 32 (see FIG. 2) via the conductive portion 28.

The conductive portion 28 is formed so as to correspond to the second base opening 44.

Specifically, the conductive portion 28 has a generally circular plan view shape, and includes a lower part 45 filling the second base opening 44 of the second insulating base layer 42, and an upper part 46 continued from the upper end of the lower part 45 to cover the upper surface of the second insulating base layer 42 around the second base opening 44.

The lower part 45 is formed to be continued to the upper surface of the element-side connecting portion 31 exposed from the second base opening 44 of the second insulating base layer 42.

The upper part 46 is formed over the upper surface of the lower part 45 and the upper surface of the second insulating base layer 42 around the second base opening 44. To the upper part 46, the outer end edge (see FIG. 2) of the element-wire supply-side portion 32 is continued.

The upper part 46 is covered with the insulating cover layer 40.

In this manner, the conductive portion 28 is electrically connected to the element-side terminal 25 via the element-side connecting portion 31, and is also electrically connected to the supply-side terminal 24 (see FIG. 1) via the element-wire supply-side portion 32. That is, the element-side terminal 25 and the element-side connecting portion 31 are electrically connected (in a conducting state) to the element-wire supply-side portion 32 and the supply-side terminal 24 via the conductive portion 28.

On the suspension board with circuit 1, as shown in FIGS. 2 and 3, the slider 3 is mounted on the slider mounting region 53 (the imaginary line of FIG. 2), and the piezoelectric elements 4 are mounted in the second board openings 16.

The slider mounting region 53 is defined in a generally rectangular plan view shape such that, over the suspension board with circuit 1, the both end portions in the left-right direction thereof are located inwardly of the both end portions in the left-right direction of the stage 14 in the left-right direction, the front end portion of the slider mounting region 53 is located generally at the middle in the front-rear direction of the stage 14 (on the rear side of each of the head-side terminals 35), and the rear end portion of the slider mounting region 53 is located generally at the middle in the front-rear direction of each of the second board openings 16.

The slider 3 has a generally rectangular plan view shape, and the lower surface of the front end portion of the slider 3 is bonded to the mounting region 27 via an adhesive layer 47 made of a known adhesive. Note that the thickness of the adhesive layer 47 is not less than, e.g., the total thickness of the insulating base layer 39 and the insulating cover layer 40.

Thus, the front end portion of the slider 3 is fixed to the mounting region 27.

The rear end portion of the slider 3 is formed so as to include the front element-side terminals 29 when projected in the thickness direction.

Specifically, the front end edge of the slider 3 is located along the rear end edges of the head-side terminals 35, and more specifically formed on the rear side of the head-side terminals 35 with a to gap interposed therebetween. Also, the magnetic head 2 mounted on the front end portion of the slider 3 is brought into contact with the head-side terminals 35 and solder balls 48. Thereafter, the solder balls 48 are melted to be soldered to the head-side terminals 35 and electrically connected thereto.

On the other hand, the rear end edge of the slider 3 is located so as to widthwise traverse the space between the front element-side terminals 29 and the rear element-side terminals 30 and the middle in the front-rear direction of the middle portion 15.

The piezoelectric elements 4 are each formed in a generally rectangular shape which is long in the front-rear direction to be extendable/contractable in the front-rear direction and disposed under the slider 3 to be spaced apart therefrom.

The piezoelectric elements 4 are also provided to be paired up such that the middle portion 15 is interposed therebetween when projected in the thickness direction. The piezoelectric elements 4 are disposed in the second board openings 16.

Specifically, the piezoelectric elements 4 are mounted so as to extend between the two pairs of element-side terminals facing each other in the front-rear direction in the second board openings 16.

More specifically, the respective upper surfaces of the front end portions of the piezoelectric elements 4 are bonded to the lower surfaces of the front element-side terminals 29, while the respective upper surfaces of the rear end portions of the piezoelectric elements 4 are bonded to the lower surfaces of the rear element-side terminals 30.

In this in the individual piezoelectric elements 4 are electrically connected to the front element-side terminals 29 and the rear element-side terminals 30, and also fixed thereto.

The piezoelectric elements 4 have parts thereof overlapping the slider 3 when projected in the thickness direction. Specifically, the front end portions of the piezoelectric elements 4 are included in the rear end portion of the slider 3.

To each of the piezoelectric elements 4, electricity is supplied from the power source 23 (FIG. 1) via the first conductive patterns 21, and the voltage thereof is controlled to thereby extend/contract the piezoelectric elements 4.

Note that, according to the illustration shown FIG. 3, the lower surface of the first insulating base layer 41 corresponding to the element wires 26 and the head wires 36 each traversing the second board openings 16 is placed on the upper surface of the middle portion in the front-rear direction of the piezoelectric element 4. Actually, however, a minute gap is provided therebetween.

Next, a producing method of the suspension board with circuit 1 is described with reference to FIGS. 6 and 7.

First, in the method, as shown in FIG. 6(a), the metal supporting board 5 in a flat plate shape is prepared.

Next, as shown in FIGS. 6(b) and 5, the first insulating base layer 41 is formed on the metal supporting board 5.

The first insulating base layer 41 is formed into a pattern formed with the first base openings 43 by, e.g., coating a varnish of a photosensitive insulating material onto the metal supporting board 5, drying the coating, exposing it to light, developing it, and curing it by heating.

Note that the first insulating base layer 41 is formed also on the metal supporting board 5 in which the first board opening 9 (see FIGS. 1 and 2) and the second board openings 16 are formed in the subsequent step (see FIG. 7(g)).

Next, as shown in FIGS. 6(c) and 5, the element-side connecting portions 31 and the element-side terminals 25 are formed on the first insulating base layer 41 by a pattern formation method such as an additive method or a subtractive method.

Next, as shown in FIGS. 6(d) and 4, the second insulating base layer 42 is formed on the first insulating base layer 41 into a pattern covering the element-side connecting portions 31 and the element-side terminals 25, and formed with the second base openings 44.

The second insulating base layer 42 is formed in the foregoing pattern by, e.g., coating a varnish of a photosensitive insulating material onto the metal supporting board 5, the first insulating base layer 41, the element-side connecting portions 31, and the element-side terminals 25, drying the coating, exposing it to light, developing it, and curing it by heating.

Next, as shown in FIGS. 7(e) and 4, the conductive portions 28, the element wires 26 (element-wire supply-side portions 32), the supply-side terminals 24 (see FIG. 1), the second conductive patterns 22 (external terminals 34, head-side terminals 35, and head wires 36) are formed on the second insulating base layer 42 by a pattern formation method such as an additive method or a subtractive method.

Next, as shown in FIG. 7(f), the insulating cover layer 40 is formed on the second insulating base layer 42 into a pattern covering the element-wire supply-side portions 32 and the head-wire outer portions 38.

Specifically, a varnish of a photosensitive insulating material is coated onto the first insulating base layer 41, the second insulating base layer 42, the first conductive pattern 21, and the second conductive pattern 22, dried, exposed to light, developed, and then cured by heating to be formed in the foregoing pattern.

Next, as shown in FIG. 7(g), the metal supporting board 5 is trimmed by e.g., etching or the like, while the first board opening 9 (see FIGS. 1 and 2) and the second board openings 16 are formed in the metal supporting board 5.

Subsequently, as shown in FIG. 3, the slider 3 provided with the magnetic head 2 is mounted on the mounting region 27 via the adhesive layer 47, while the two piezoelectric elements 4 are bonded to the respective element-side terminals 25 so as to extend between the two pairs of element-side terminals 25 (front element-side terminals 29 and rear element-side terminals 30).

Thereafter, as shown in FIG. 1, the power source 23 is connected to the supply-side terminals 24, while the read/write beard 33 is connected to the external terminals 34.

In this manner, the suspension board with circuit 1 is obtained.

Next, the swing of the slider 3 resulting from the extension/contraction of the piezoelectric elements 4 is described with reference to FIG. 8.

First, electricity is supplied from the power source 23 (FIG. 1) to the piezoelectric elements 4 via the element-side terminals 25, and the voltage of the electricity is controlled to contract one of the piezoelectric elements 4. Consequently, the front element-side terminal 29 and the rear element-side terminal 30 which fix the one of the piezoelectric elements 4 move relatively closer to each other. That is, the one of the front element-side terminals 29 supported by the stage 14 moves rearwardly toward the one of the rear element-side terminals 30 supported by the base portion 13.

At the same time, electricity is supplied from the power source 23 (FIG. 1) via the element-side terminals 25, and the voltage of the electricity is controlled to extend the other piezoelectric element 4. Consequently, the front element-side terminal 29 and the rear element-side terminal 30 which fix the other piezoelectric element 4 move relatively further away from each other. That is, the other front element-side terminal 29 supported by the stage 14 moves frontwardly away from the other rear element-side terminal 30 supported by the base portion 13.

As a result, the stage 14 swings outwardly in one widthwise direction around the rear end of the middle portion 15, while the front end of the middle portion 15 and a midway portion in the front-rear direction thereof are curved outwardly in one widthwise direction. At the same time, the slider 3 swings outwardly in one widthwise direction.

On the other hand, if one of the piezoelectric elements 4 is extended and the other piezoelectric element 4 is contracted, the slider 3 swings in a direction opposite to the foregoing direction, though not shown.

In the suspension board with circuit 1, the element-side connecting portions 31 and the head-side connecting portions 37 are formed on each of the first insulating base layer 41 and the second insulating base layer 42.

This can achieve higher flexibility in designing the layout of the element-side connecting portions 31 and the head-side connecting portions 37 and also allow the element-side terminals 25 and the head-side terminals 35 respectively continued thereto to be formed at placement densities which do not cause a short circuit.

As a result, it is possible to improve the reliability of connection between the element-side terminals 25 and the heat-side terminals 35, while achieving compactization.

In the suspension board with circuit 1, the piezoelectric elements 4 are provided to extend between the front element-side terminals 29 and the rear element-side terminals 30. Accordingly, by bringing the base portion 13 and the stage 14 relatively further away from or closer to each other through the extension and contraction of the piezoelectric elements 4, it is possible to reliably swing the slider 3 in the both widthwise directions.

Also, in the suspension board with circuit 1, the piezoelectric elements 4 are disposed in the second board openings 16 of the metal supporting board 5, and therefore the suspension board with circuit 1 can be thinned.

Moreover, since the piezoelectric elements 4 overlap the rear end portion of the slider 3, by bringing the base portion 13 and the stage 14 relatively further away from or closer to each other, the slider 3 can be accurately swung.

Second Embodiment

Referring to FIGS. 9 to 13, a second embodiment of the suspension board with circuit is described. Note that, in FIGS. 9 to 13, the same members as used in the first embodiment described above are designated by the same reference numerals, and a detailed description thereof is omitted.

Figure 9:
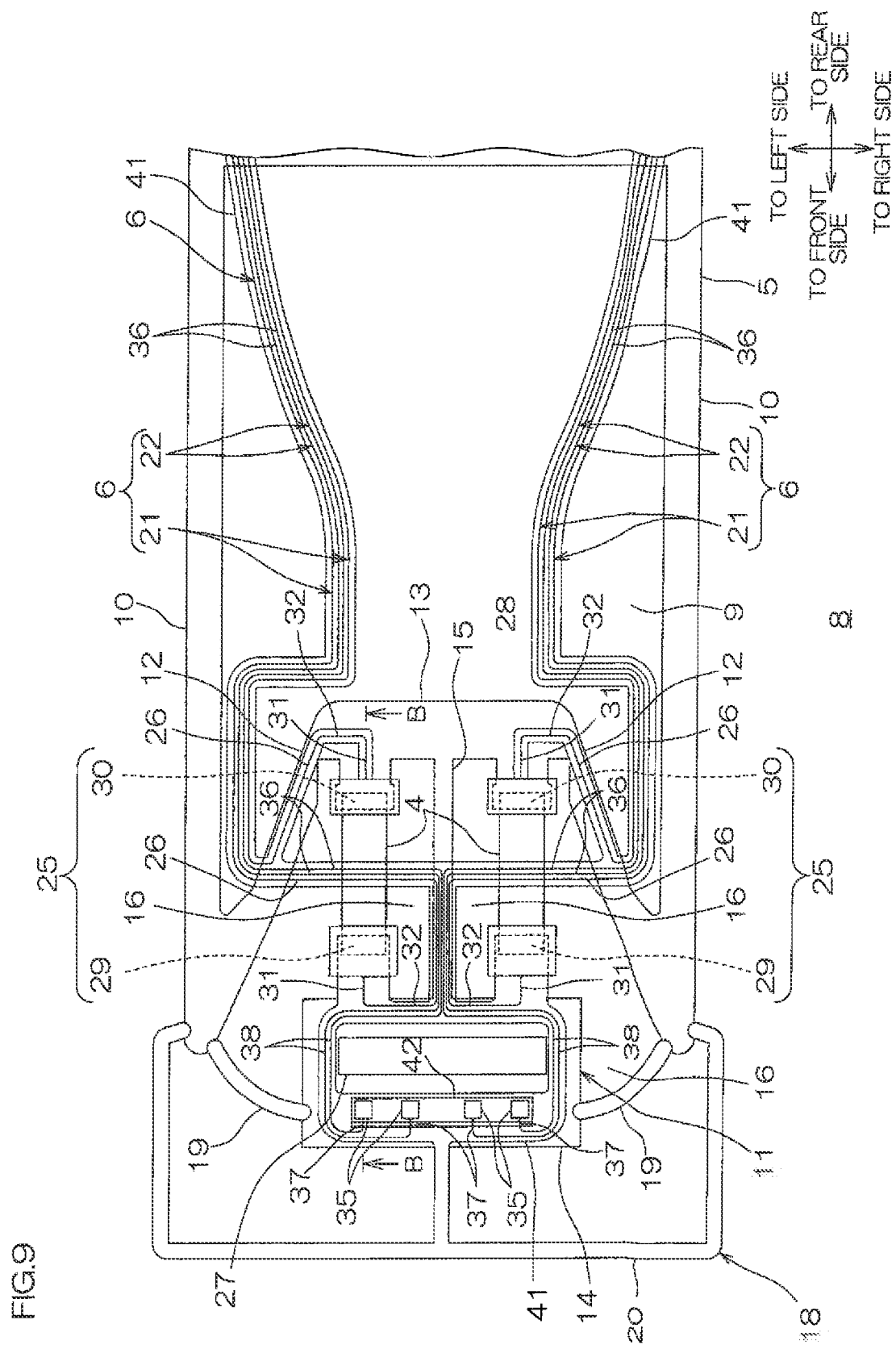
FIG. 9 shows an enlarged plan view of the gimbal portion of a suspension board with circuit as a second embodiment (a form in which element-wire supply-side portions and head-wire outer portions are formed on a first insulating base layer) of the wired circuit board of the present invention.
Figure 10:
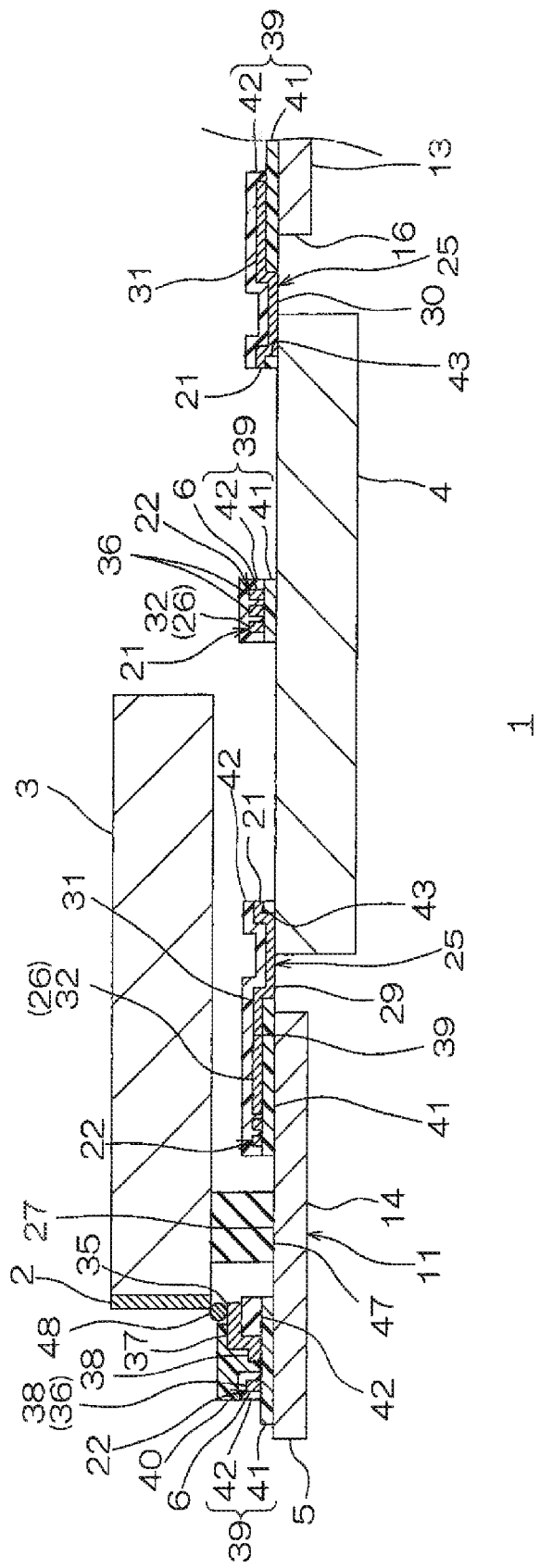
FIG. 10 shows a cross-sectional view along the line B-B of the gimbal portion shown in FIG. 9.

FIG. 9 shows an enlarged plan view of the gimbal portion of the suspension board with circuit as the second embodiment (a form in which element-wire supply-side portions and head-wire outer portions are formed on a first insulating base layer) of the wired circuit board of the present invention. FIG. 10 shows a cross-sectional view along the line B-B of the gimbal portion shown in FIG. 9. FIG. 11 shows a perspective view of head-side connecting portions. FIG. 12 is a process view for illustrating a producing method of the suspension board with circuit shown in FIG. 9.

Note that, in FIG. 11, the insulating cover layer 40 is omitted for clear illustration of relative positioning of the insulating base layer 39 and the conductive layer 6.

In the first embodiment described above, both of the element-wire supply-side portions 32 and the head-wire outer portions 38 are formed on the second insulating base layer 42. However, as shown in, e.g., FIGS. 9 to 11, it is also possible to, e.g., form both of the element-wire supply-side portions 32 and the head-wire outer portions 38 on the first insulating base layer 41.

As shown in FIGS. 9 to 11, it is also possible to, e.g., form the head-wire outer portions 38 along the end surfaces of the second insulating base layer 42 without forming the second base openings 44 in the second insulating base layer 42 nor providing the conductive portions 28, and thereby connect the head-wire outer portions 38 to the head-side connecting portions 37.

Next, referring to FIGS. 9 to 11, a detailed description is given to the head-side connecting portions 37 and the head-side terminals 35 of the second embodiment.

As shown in FIGS. 9 and 10, the first insulating base layer 41 is provided on the upper surface of the metal supporting board 5 to extend over the main body portion 7 and the gimbal portion 8.

On the upper surface of the first insulating base layer 41, the element wires 26 (element-side connecting portions 31 and the element-wire supply-side portions 32) and the head-wire outer portions 38 of the head wires 36 are formed.

Also, on the upper surface of the first insulating base layer 41, the second insulating base layer 42 is formed in a pattern covering the element wires 26 (element-wire supply-side portions 32 and element-side connecting portions 31) and the head-wire outer portions 38.

As shown in FIGS. 9 to 11, on the front end portion of the stage 14, the second insulating base layer 42 corresponding to the head-side terminals 35 and the head-side connecting portions 37 is formed in a generally box shape which is long in the widthwise direction and, over the front end surface and upper surface of the second insulating base layer 42, the head-side connecting portions 37 are continuously formed.

That is, the head-side connecting portions 37 are formed to extend upwardly from the rear end portions of the head-wire outer portions 38 along the front end surface of the second insulating base layer 42, then be bent rearwardly, extend rearwardly over the upper surface of the second insulating base layer 42, and reach the head-side terminals 35.

On the head-side terminals 35 and the head-side connecting portions 37, as shown in FIG. 10, the insulating cover layer 40 is formed.

The insulating cover layer 40 is formed on the first insulating base layer 41 and the second insulating base layer 42 so as to cover the head-side terminals 35 and the head-side connecting portions 37.

Next, a producing method of the suspension board with circuit 1 is described with reference to FIGS. 12 and 13.

First, in the method, as show FIG. 12(a), the metal supporting board 5 is prepared.

Then, as shown in FIG. 12(b), the first insulating base layer 41 is formed on the metal supporting board 5.

Then, as shown in FIG. 12(c), the first conductive pattern 21 (supply-side terminals 24 (FIG. 1), the element-side terminals 25, and the element wires 26), the external terminals 34 (FIG. 1), and the head-wire outer portions 38 are formed on the first insulating base layer 41.

Then, as shown in FIGS. 12(d) and 11, the second insulating base layer 42 is formed on the first insulating base layer 41 into the foregoing pattern.

Then, as shown in FIGS. 13(e) and 11, the head-side terminals 35 and the head-side connecting portions 37 are formed on the second insulating base layer 42.

Then, as shown in FIG. 13(f), the insulating cover layer 40 is formed on the first insulating base layer 41 and the second insulating base layer 42 into a pattern covering the head-side connecting portions 37.

Then, as shown in FIG. 13(g), the metal supporting board 5 is trimmed by, e.g., etching, while the first board opening 9 (FIG. 9) and the second board openings 16 are formed in the metal supporting board 5.

Thereafter, as shown in FIG. 10, the slider 3 provided with the magnetic head 2 is mounted on the mounting region 27, while the two piezoelectric elements 4 are bonded to the respective element-side terminals 25 so as to extend between the two pairs of element-side terminals 25.

Subsequently, as shown in FIG. 1, the power source 23 is connected to the supply-side terminals 24, while the read/write board 33 is connected to the external terminals 34.

In this manner, the suspension board with circuit 1 is obtained.

Third Embodiment

Figure 14:
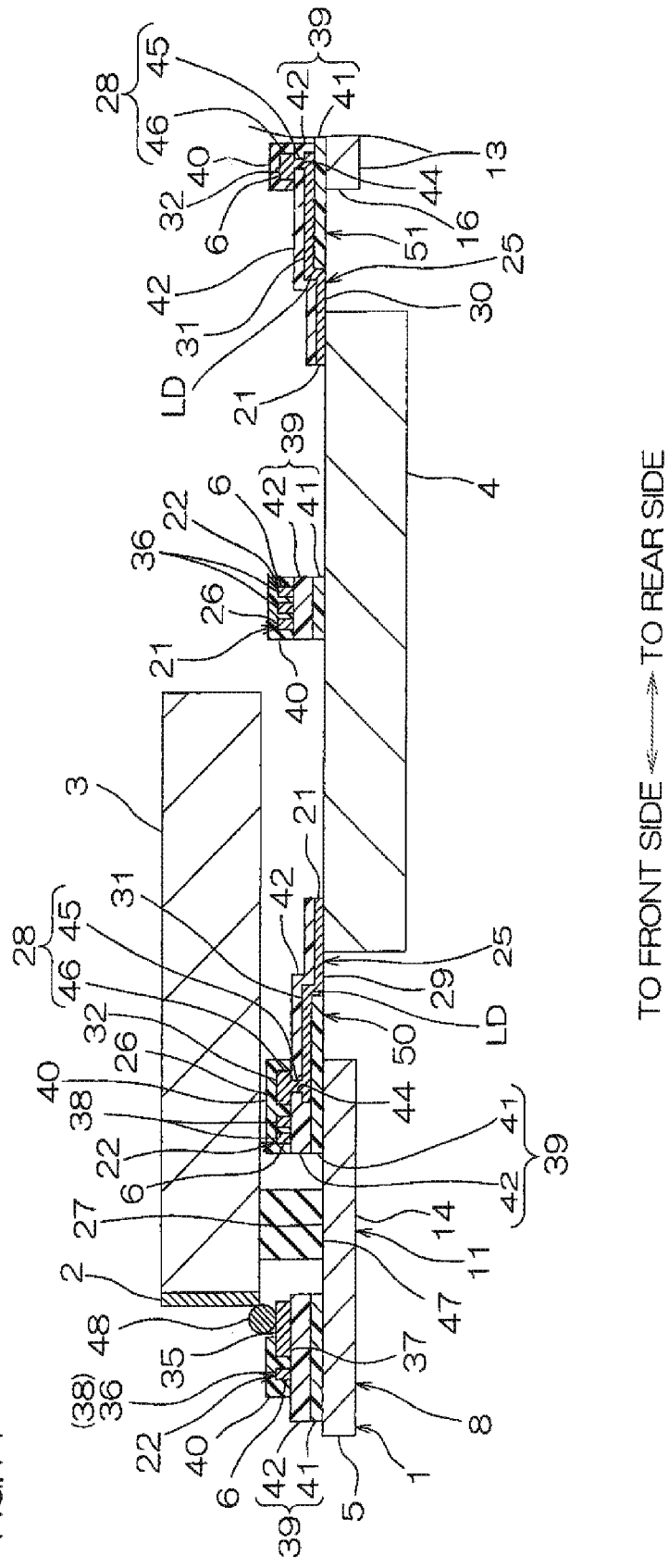
FIG. 14 shows a cross-sectional view of the gimbal portion of a suspension board with circuit as a third embodiment of the wired circuit board of the present invention.

Referring to FIGS. 14 to 16, a third embodiment of the suspension board with circuit is described. Note that, in FIGS.

14 to 16, the same members as used in the first embodiment described above are designated by the same reference numerals, and a detailed description thereof is omitted.

FIG. 14 shows a cross-sectional view of the gimbal portion of the suspension board with circuit as the third embodiment of the wired circuit board of the present invention. FIGS. 15 and 16 are process views for illustrating a producing method of the suspension board with circuit shown in FIG. 14.

In the first embodiment described above, the projecting end portion 49 of the front-side projecting portion 50 and the projecting end portion 49 of the rear-side projecting portion 51 are each formed in a generally rectangular frame plan view shape, and the front element-side terminals 29 and the rear element-side terminals 30 are formed so as to be downwardly fitted in the frames of the corresponding projecting end portions 49.

By contrast, in the third embodiment, as shown in FIG. 14, the front-side projecting portion 50 and the rear-side projecting portion 51 are not formed with the projecting end portions 49. The front element-side terminals 29 are formed to protrude rearwardly of the front-side projecting portion 50, while the rear element-side terminals 30 are formed to protrude forwardly of the rear-side projecting portion 51.

Specifically, in the third embodiment, the front element-side terminals 29 are continued to the rear end portions of the element-side connecting portions 31 formed on the front-side projecting portion 50 of the first insulating base layer 41 to extend downwardly along the rear end surface of the front-side projecting portion 50 of the first insulating base layer 41, be bent rearwardly at the lower end portion thereof, and extend to the rear side. The lower surfaces of the front element-side terminals 29 are formed to be flush with the lower surface of the front-side projecting portion 50.

The rear element-side terminals 30 are continued to the front end portions of the element-side connecting portions 31 formed on the rear-side projecting portion 51 of the first insulating base layer 41 to extend downwardly along the front end surface of the rear-side projecting portion 51 of the first insulating base layer 41, be bent frontwardly at the lower end portion thereof, and extend to the front side. The lower surfaces of the rear element-side terminals 30 are formed to be flush with the lower surface of the rear-side projecting portion 51.

In the third embodiment, to produce the suspension board with circuit 1, the metal supporting board 5 is prepared first, as shown in FIG. 15(a).

Next, as shown in FIG. 15(b), the first insulating base layer 41 is formed on the metal supporting board 5 into the same pattern as used in the first embodiment described above except that the front-side projecting portion 50 and the rear-side projecting portion 51 are not formed with the projecting end portions 49.

Next, as shown in FIG. 15(c), the first conductive patterns 21 (supply-side terminals 24 (FIG. 1), element-side terminals 25, and element wires 26), the external terminals 34 (FIG. 1), and the head-wire outer portions 38 are formed on the first insulating layer 41. At this time, as described above, the front element-side terminals 29 are formed so as to protrude rearwardly of the front-side projecting portion 50, and the rear element-side terminals 30 are formed so as to protrude forwardly of the rear-side projecting portion 51.

Next, as shown in FIGS. 15(d) and 11, the second insulating base layer 42 is formed on the first insulating base layer 41 into the pattern described above.

Next, as shown in FIGS. 16(e) and 11, the head-side terminals 35 and the head-side connecting portions 37 are formed on the second insulating base layer 42.

Next, as shown in FIG. 16(f), the insulating cover layer 40 is formed on the first insulating base layer 41 and the second insulating base layer 42 into a pattern covering the head-side connecting portions 37.

Next, as shown in FIG. 16(g), the metal supporting board 5 is trimmed by, e.g., etching or the like, while the first board opening 9 and the second board openings 16 are formed in the metal supporting board 5.

In this manner, the suspension board with circuit 1 is obtained.

In the third embodiment also, the same operation/effect as obtained in the first embodiment described above can be obtained.

Fourth Embodiment

Figure 17:
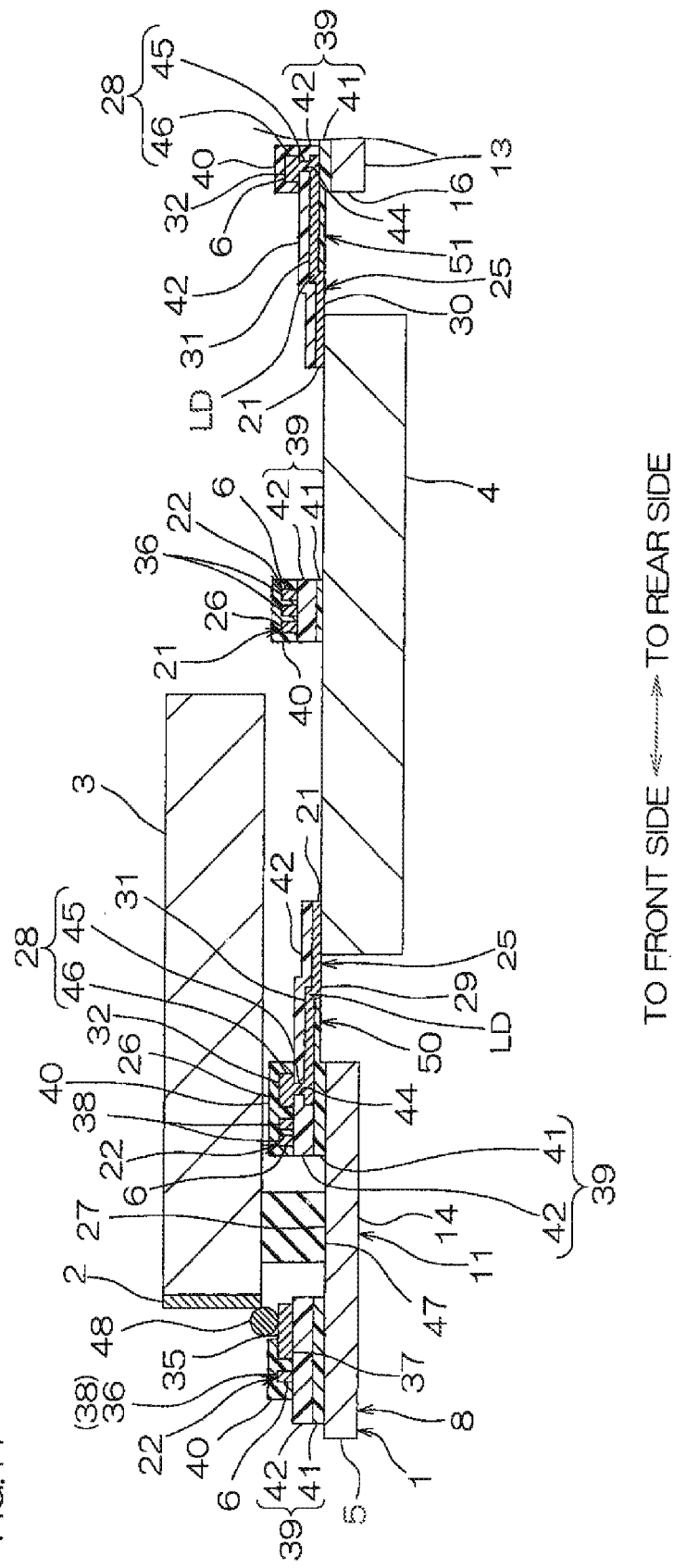
FIG. 17 shows a cross-sectional view of the gimbal portion of a suspension board with circuit as a fourth embodiment of the wired circuit board of the present invention.

Referring to FIGS. 17 to 19, a fourth embodiment of the suspension board with circuit is described. Note that, in FIGS. 17 to 19, the same members as used in the third embodiment described above are designated by the same reference numerals, and a detailed description thereof is omitted.

FIG. 17 shows a cross-sectional view of the gimbal portion of the suspension board with circuit as the fourth embodiment of the wired circuit board of the present invention. FIGS. 18 and 19 are process views for illustrating a producing method of the suspension board with circuit shown in FIG. 17.

In the third embodiment described above, the level difference LD between the element-side connecting portions 31 formed on the front-side projecting portion 50 and the front element-side terminals 29 and the level difference LD between the element-side connecting portions 31 formed on the rear-side projecting portion 51 and the rear element-side terminals 30 can be adjusted as necessary.

For example, as shown in FIG. 17, in the fourth embodiment, the level difference LD between the element-side connecting portions 31 formed on the front-side projecting portion 50 and the front element-side terminals 29 and the level difference LD between the element-side connecting portions 31 formed on the rear-side projecting portion 51 and the rear element-side terminals 30 are adjusted to be about half the level differences LD in the third embodiment.

In the fourth embodiment, to produce the suspension board with circuit 1, the metal supporting board 5 is prepared first, as shown in FIG. 18(a).

Next, as shown in FIG. 18(b), the first insulating base layer 41 is formed on the metal supporting board 5 into the same pattern as used in the first embodiment described above except that a stepped portion 52 is formed in each of the rear end portion of the front-side projecting portion 50 and the front end portion of the rear-side projecting portion 51.

To form the stepped portion 52 in each of the rear end portion of the front-side projecting portion 50 and the front end portion of the rear-side projecting portion 51, a photosensitive insulating material is subjected to gradation exposure using a photomask having a gradation pattern including light shielding portions, transmitting portions, and semi-transmitting portions, and then developed. In the gradation exposure, the light shielding portions are caused to face portions not to be formed with the first insulating base layer 41, the transmitting portions are caused to face portions to be formed with the first insulating base layer 41, and the semi-transmitting portions are caused to face the parts of the portions to be formed with the first insulating base layer 41 which are to be formed with the stepped portions 52.

Next, as shown in FIG. 18(c), the first conductive patterns 21 (supply-side terminals 24 (FIG. 1), element-side terminals 25, and element wires 26), the external terminals 34 (FIG. 1), and the head-wire outer portions 38 are formed on the first insulating layer 41. At this time, as described above, the front element-side terminals 29 and the rear element-side terminals 30 are formed on the stepped portions 52.

Next, as shown in FIGS. 18(d) and 11, the second insulating base layer 42 is formed on the first insulating base layer 41 into the pattern described above.

Next, as shown in FIGS. 19(e) and 11, the head-side terminals 35 and the head-side connecting portions 37 are formed on the second insulating base layer 42.

Next, as shown in FIG. 19(f), the insulating cover layer 40 is formed on the first insulating base layer 41 and the second insulating base layer 42 into a pattern coveting the head-side connecting portions 37.

Next, as shown in FIG. 19(g), the metal supporting board 5 is trimmed by, e.g., etching or the like, while the first board opening 9 and the second board openings 16 are formed in the metal supporting board 5.

Next, as shown in FIG. 19(h), the first insulating base layer 41 exposed in the second board openings 16 (the lower halves of the front-side projecting portion 50 and the rear-side projecting portion 51 and the stepped portions 52) are etched to expose the lower surfaces of the front element-side terminals 29 and the rear element-side terminals 30.

In this manner, the suspension board with circuit 1 is obtained.

In the fourth embodiment also, the same operation/effect as obtained in the third embodiment described above can be obtained.

Fifth Embodiment

Figure 20:
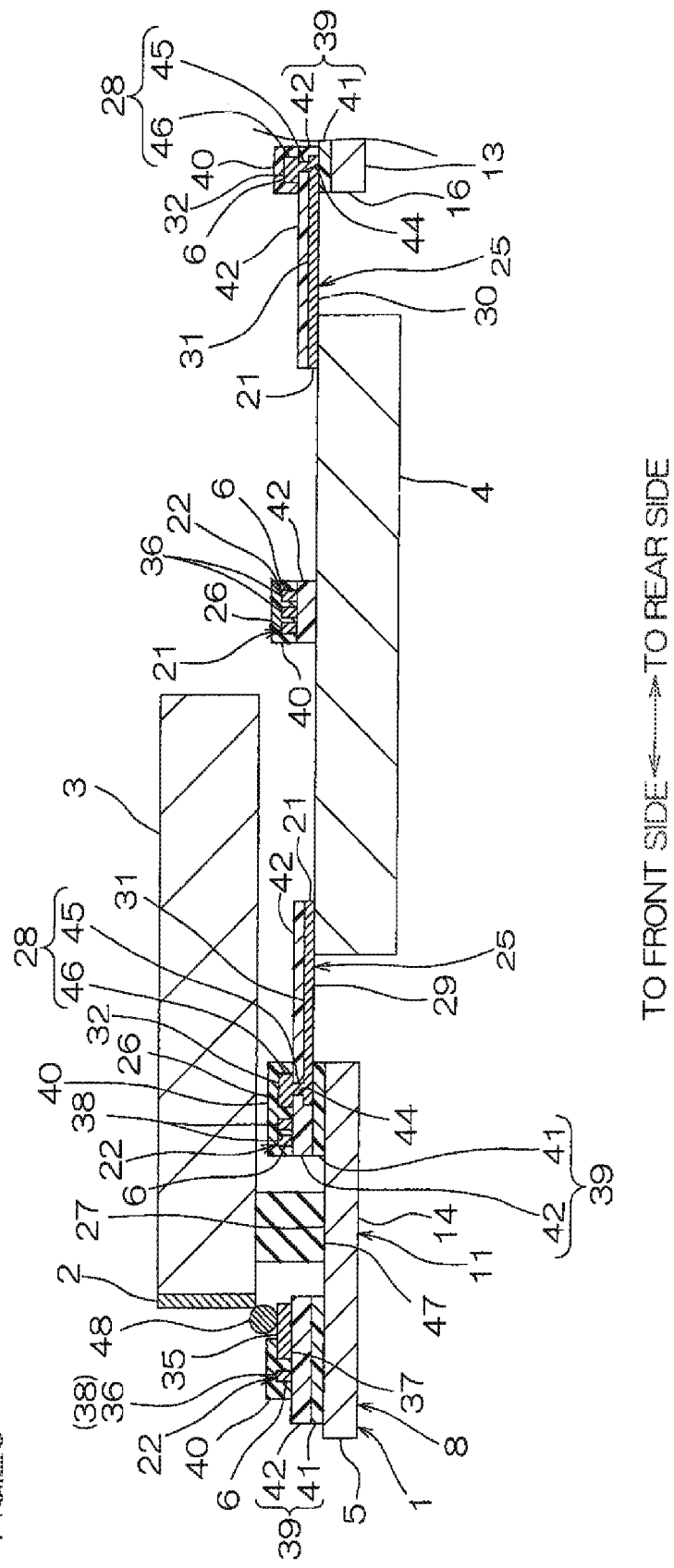
FIG. 20 shows a cross-sectional view of the gimbal portion of a suspension board with circuit as a fifth embodiment of the wired circuit board of the present invention.

Referring to FIGS. 20 to 22, a fifth embodiment of the suspension board with circuit is described. Note that, in FIGS. 20 to 22, the same members as used in the fourth embodiment described above are designated by the same reference numerals, and a detailed description thereof is omitted.

FIG. 20 shows a cross-sectional view of the gimbal portion of the suspension board with circuit as the fifth embodiment of the wired circuit board of the present invention. FIGS. 21 and 22 are process views for illustrating a producing method of the suspension board with circuit shown in FIG. 20.

In the fourth embodiment described above, as shown in FIG. 20, it is also possible not to form a level difference between the element-side connecting portions 31 formed on the front-side projecting portion 50 and the front element-side terminals 29 and a level difference between the element-side connecting portions 31 formed en the rear-side projecting portion 51 and the rear element-side terminals 30.

In the fifth embodiment, to produce the suspension board with 1, the metal supporting board 5 is prepared first, as shown in FIG. 21(a).

Next, as shown in FIG. 21(b), the first insulating base layer 41 is formed on the metal supporting board 5 into the same pattern as used in the fourth embodiment described above except that no stepped portion is formed in either the rear end portion of the front-side projecting portion 50 or the front end portion of the rear-side projecting portion 51.

Next, as shown in FIG. 21(c), the first conductive patterns 21 (supply-side terminals 24 (FIG. 1), element-side terminals 25, and element wires 26), the external terminals 34 (FIG. 1), and the head-wire outer portions 38 are formed on the first insulating layer 41.

Next, as shown FIGS. 21(d) and 11, the second insulating base layer 42 is formed on the first insulating base layer 41 into the pattern described above.

Next, as shown FIGS. 22(e) and 11, the head-side terminals 35 and the be side connecting portions 37 are formed on the second insulating base layer 42.

Next, as shown in FIG. 22(f), the insulating cover layer 40 is formed on the first insulating base layer 41 and the second insulating base layer 42 into a pattern covering the head-side connecting portions 37.

Next, as shown in FIG. 22(g), the metal supporting board 5 is trimmed by, e.g., etching or the like, while the first board opening 9 and the second board openings 16 are formed in the metal supporting board 5.

Next, as shown in FIG. 22(h), the first insulating base layer 41 exposed in the second hoard openings 16 is etched to expose the lower surfaces of the front element-side terminals 29 and the rear element-side terminals 30. Note that, by the etching, the first insulating base layer 41 exposed in the second hoard openings 16 (portions corresponding to the front-side projecting portion 50 and the rear-side projecting portion 51 in the fourth embodiment) is entirely etched.

In this manner, the suspension board with circuit 1 is obtained.

In the fifth embodiment also, the same operation/effect as obtained in the fourth embodiment described above can be obtained.

Sixth Embodiment

Figure 23:
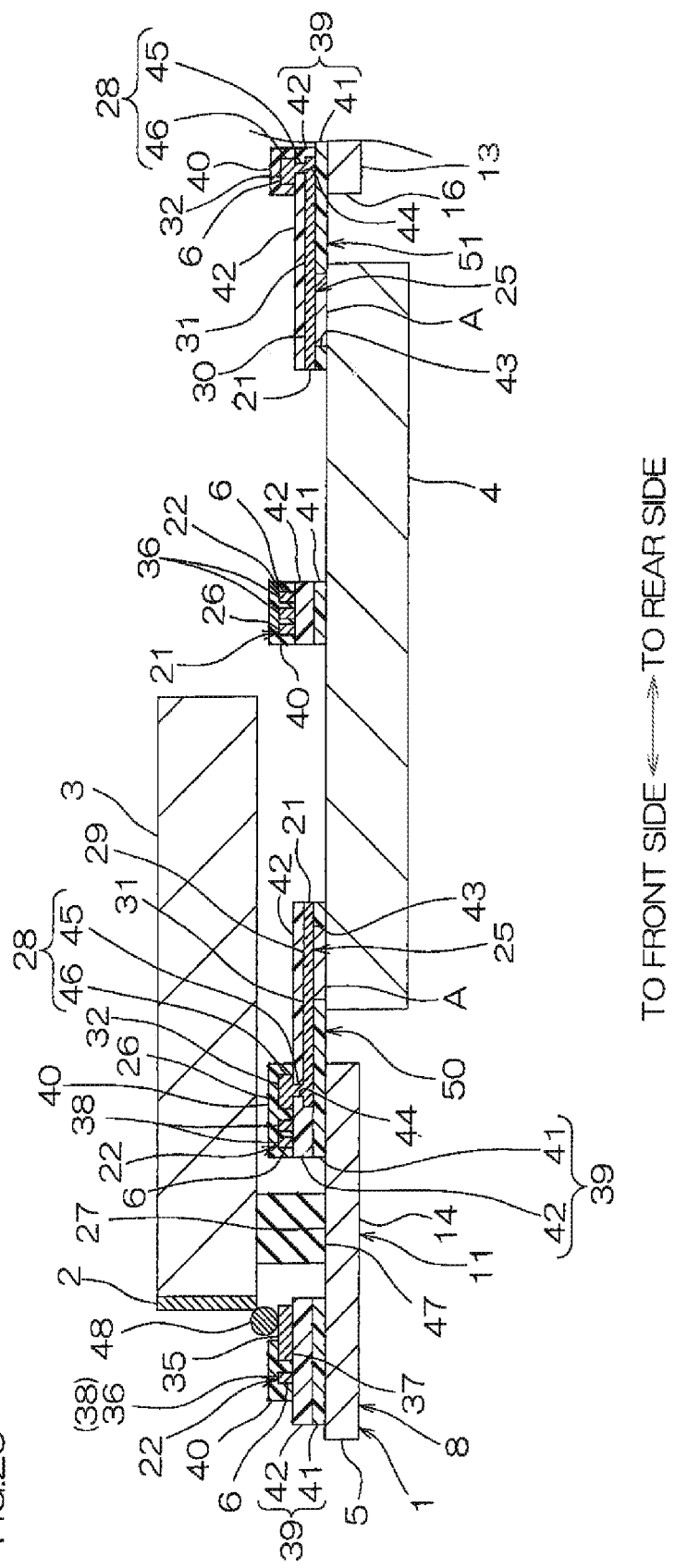
FIG. 23 shows a cross-sectional view of the gimbal portion of a suspension board with circuit as a sixth embodiment of the wired circuit board of the present invention.

Referring to FIGS. 21 to 23, a sixth embodiment of the suspension board with circuit is described. Note that, in FIGS. 21 to 23, the same members as used in the first embodiment described above are designated by the same reference numerals, and a detailed description thereof is omitted.

FIG. 23 shows a cross-sectional view of the gimbal portion of the suspension board with circuit as the sixth embodiment of the wired circuit board of the present invention.

In the first embodiment described above, the projecting end portion 49 of the front-side projecting portion 50 and the projecting end portion 49 of the rear-side projecting portion 51 are each formed in a generally rectangular frame plan view shape, and the front element-side terminals 29 and the rear element-side terminals 30 are formed so as to be downwardly fitted in the frames of the corresponding projecting end portions 49.

By contrast, in the sixth embodiment, as shown in FIG. 23, the front element-side terminals 29 and the rear element-side terminals 30 are each formed in a generally linear cross-sectional view shape extending along the front-rear direction so as not to be fitted in the frames of the corresponding projecting end portions 49.

In the sixth embodiment, to produce the suspension board with circuit 1, the metal supporting board 5 is prepared first in the same manner as in the fifth embodiment described above, as shown in FIG. 21(a).

Next, as shown in FIG. 21(b), the first insulating base layer 41 is formed on the metal supporting board 5.

Next, as shown in FIG. 21(c), the first conductive patterns 21 (supply-side terminals 24 (FIG. 1), element-side terminals 25, and element wires 26), the external terminals 34 (FIG. 1), and the head-wire outer portions 38 are formed on the first insulating layer 41.

Next, as shown in FIGS. 21(d) and 11, the second insulating base layer 42 is formed on the first insulating base layer 41 into the pattern described above.

Next, as shown in FIGS. 22(e) and 11, the head-side terminals 35 and the head-side connecting portions 37 are formed on the second insulating base layer 42.

Next, as shown in FIG. 22(f), the insulating cover layer 40 is formed on the first insulating base layer 41 and the second insulating base layer into a pattern covering the head-side connecting portions 37.

Next, as shown in FIG. 22(g), the metal supporting board 5 is trimmed by, e.g., etching or the like, while the first board opening 9 and the second board openings 16 are formed in the metal supporting hoard 5.

Then, in the sixth embodiment, as shown in FIG. 22(h), the first insulating base layer 41 exposed in the second board openings 16 is partially etched to form the first base opening 43 (FIG. 23) which partially exposes the lower surfaces of the front element-side terminals 29 and the rear element-side terminals 30.

In this manner, the suspension board with circuit 1 is obtained.

Note that, in the sixth embodiment, the piezoelectric elements 4 are electrically connected to the front element-side terminals 29 and the rear element-side terminals 30 via a conductive adhesive layer A filling the first base opening 43.

In the sixth embodiment also, the same operation/effect as obtained in the first embodiment described above can be obtained.

Other Modifications

Note that, in the first embodiment described above, the first insulating base layer 41 is provided to extend over the main body portion 7 and the gimbal portion 8. However, for example, as shown by the imaginary line of FIG. 5, the first insulating base layer 41 can also be formed under the element-side connecting portions 31 so as to correspond only to the element-side connecting portions 31 in the gimbal portion 8.

In the first embodiment described above, the metal supporting hoard 5 is formed throughout the longitudinal direction of the suspension board with circuit 1. However, for example, the metal supporting board 5 can also be formed only in the main body portion 7 without being formed in the gimbal portion 8, though not shown. In that case, the gimbal portion 8 is formed of the insulating base layer 39, the conductive layer 6, and the insulating cover layer 40.

Also, in the first embodiment described above, the wired circuit board of the present invention is described as the suspension board with circuit 1. However, the wired circuit board of the present invention can also be e.g., a flexible wired circuit board with reinforcing layer which includes the metal supporting board 5 as a reinforcing layer or a flexible wired circuit board which does not include the metal supporting board 5, though not shown While the illustrative embodiments of the present invention are provided in the above description, such is for illustrative purpose only and it is not to be construed restrictively. Modification and variation of the present invention that will be obvious to those skilled in the art is to be covered by the following claims.

What is claimed is:

1. A wired circuit board, comprising:
an insulating layer; and
a conductive layer formed on the insulating layer, wherein
the insulating layer includes a first insulating layer, and a second insulating layer formed on the first insulating layer,
the conductive layer includes a first conductive pattern, and a second conductive pattern provided independently of the first conductive pattern,
the first conductive pattern includes a first connecting portion formed on the first insulating layer and under the second insulating layer, and at least one pair of first terminals configured to be electrically connected to the first connecting portion so as to be electrically connected to an external electronic element, the at least one pair of first terminals being provided to be spaced apart from each other to allow the electronic element to be disposed at the at least one pair of first terminals to extend therebetween, and
the second conductive pattern includes a second connecting portion formed on the second insulating layer, and a second terminal configured continuously to the second connecting portion so as to be electrically connected to a magnetic head provided on an external slider.

2. A wired circuit board according to claim 1, wherein
the first conductive pattern includes a first wire electrically connected to the first connecting portion,
the second conductive pattern includes a second wire electrically connected to the second connecting portion, and
the first wire and the second wire are formed on the second insulating layer.

3. A wired circuit board according to claim 1, wherein
the first conductive pattern includes a first wire electrically connected to the first connecting portion,
the second conductive pattern includes a second wire electrically connected to the second connecting portion, and
the first wire and the second wire are formed on the first insulating layer.

4. A wired circuit board according to claim 1, further comprising:
a metal supporting board formed under the first insulating layer, wherein
the metal supporting board is formed with an opening extending therethrough in a thickness direction to allow the electronic element to be disposed therein.

5. A wired circuit board according to claim 4, wherein the opening is formed so as to overlap at least one part of the slider in the thickness direction.

6. A wired circuit board according to claim 1, wherein the electronic element is a piezoelectric element.

7. A wired circuit board according to claim 1, wherein the wired circuit board is used as a suspension board with circuit.

8. A wired circuit board according to claim 1, wherein the first terminals provided to be spaced apart from each other face each other in the front-rear direction of the wired circuit board.

* * * * *